United States Patent
Aas et al.

(10) Patent No.: US 7,340,366 B2
(45) Date of Patent: Mar. 4, 2008

(54) METHOD AND APPARATUS OF TEMPERATURE COMPENSATION FOR INTEGRATED CIRCUIT CHIP USING ON-CHIP SENSOR AND COMPUTATION MEANS

(75) Inventors: Arne Aas, Trondheim (NO); Gunnar Gangstø, Trondheim (NO)

(73) Assignee: Atmel Corporation, San Jose, CA (US)

(*) Notice: Subject to any disclaimer, the term of this patent is extended or adjusted under 35 U.S.C. 154(b) by 330 days.

(21) Appl. No.: 10/795,027

(22) Filed: Mar. 4, 2004

(65) Prior Publication Data
US 2005/0197795 A1    Sep. 8, 2005

(51) Int. Cl.
*G01K 7/00* (2006.01)

(52) U.S. Cl. .......................... 702/130; 702/99

(58) Field of Classification Search .................. 702/75, 702/85, 89, 91, 99, 107, 116, 117, 118, 123, 702/124, 126, 130, 147, 105; 324/105, 101; 320/101, 66, 158; 331/66, 158; 372/34
See application file for complete search history.

(56) References Cited

U.S. PATENT DOCUMENTS

| | | | | |
|---|---|---|---|---|
| 4,315,209 A * | 2/1982 | Schmoock | .................. | 323/313 |
| 4,326,171 A * | 4/1982 | Shaw et al. | .................. | 330/256 |
| 4,349,775 A * | 9/1982 | Kwon et al. | ................. | 320/101 |
| 4,419,880 A * | 12/1983 | Hanowich | ................... | 73/1.22 |
| 4,537,515 A * | 8/1985 | Dinger et al. | ................ | 368/202 |
| 5,178,468 A * | 1/1993 | Shiokawa et al. | ........... | 374/185 |
| 5,534,773 A * | 7/1996 | Tsugai et al. | ................ | 324/105 |
| 5,705,957 A * | 1/1998 | Oka et al. | ....................... | 331/66 |
| 5,841,996 A | 11/1998 | Nolan et al. | ................. | 395/309 |
| 5,955,869 A | 9/1999 | Rathmann | .................... | 320/132 |
| 6,025,698 A | 2/2000 | Friel et al. | ................... | 320/106 |
| 6,084,441 A * | 7/2000 | Kawai | .......................... | 327/99 |
| 6,651,020 B2 * | 11/2003 | More | .......................... | 702/99 |
| 6,788,156 B2 * | 9/2004 | Tam et al. | ..................... | 331/49 |
| 2002/0158700 A1* | 10/2002 | Nemoto | ...................... | 331/158 |
| 2004/0091005 A1* | 5/2004 | Hofmeister et al. | .......... | 372/34 |
| 2004/0124902 A1* | 7/2004 | Choe | ........................... | 327/334 |
| 2004/0135643 A1* | 7/2004 | Clabes et al. | ................. | 331/57 |

OTHER PUBLICATIONS

MAX6325/MAX6341/MAX6350 voltage reference, MAXIM Integrated Products, Apr. 1997, 12 pages.

* cited by examiner

*Primary Examiner*—Edward Raymond
*Assistant Examiner*—Mohamed Charioui
(74) *Attorney, Agent, or Firm*—Schneck & Schneck; Thomas Schneck

(57) ABSTRACT

A method and apparatus of temperature compensation for an integrated circuit using on-chip circuits, sensors, and an algorithm. The chip includes an on-chip reference circuit, an on-chip sensor measuring a parameter relative to the reference, and an on-chip computation means for processing an algorithm. A supplemental off-chip reference circuit is also used. The algorithm carries out the following steps: (A) performing a first calibration of an internal reference residing in an integrated circuit system on-chip at a first (higher) temperature at a first testing site, and (B) utilizing calibration data obtained at the step (A) to perform a second calibration of the internal reference source residing on the integrated system on-chip at a second (lower) temperature at a second testing site.

57 Claims, 10 Drawing Sheets

US 7,340,366 B2

METHOD AND APPARATUS OF TEMPERATURE COMPENSATION FOR INTEGRATED CIRCUIT CHIP USING ON-CHIP SENSOR AND COMPUTATION MEANS

TECHNICAL FIELD

The present invention relates to temperature compensated integrated circuits.

BACKGROUND ART

Prior art temperature compensated integrated circuits (IC) are used mostly in the battery management systems. U.S. Pat. No. 5,955,869 discloses a method for monitoring remaining capacity of a battery pack. There are two different procedures that are used to estimate the battery pack remaining capacity. In a first procedure, data is generated on the battery pack to estimate remaining battery capacity; and in the second procedure, data transmitted to the battery pack from a host device is used to estimate remaining battery capacity. The battery pack switches between these two procedures. For example, the battery pack switches from the first procedure to the second procedure when the battery current falls below a threshold value.

More specifically, the '869 patent discloses a smart battery device installed in a host computer that optimizes the performance of the rechargeable battery throughout its life cycle. The smart battery device includes ASIC further comprising the following five basic blocks: processor core (CPU), analog to digital converter (A/D), program memory and look-up tables (ROM), data memory (RAM), and the I2C/SM Bus communications interface. The primary goal of these components is to measure, calculate, and communicate the status of the smart battery. Each of the above blocks includes additional hardware and software components required to perform the specific task. Some of these components are shared between components, such as the internal clock oscillator which is used by the CPU and the A/D. The calibration technique used in the '869 patent requires two values, a slope adjustment, and a correction offset. The temperature measurement requires two values made by an on-chip temperature measuring device. A ROM memory stores software for the calibration program, and A/D converters are used to convert voltage measurement to digital signals.

U.S. Pat. No. 5,841,996 discloses a serial communication interface system having programmable micro controller for use in a battery pack. The micro controller includes a microprocessor and various front-end analog circuitry such as a slope A/D converter and a multiplexer for allowing a plurality of analog input signals to be converted to corresponding digital counts indicative of signal level. In order to make the measurements of the selected analog inputs more precise, the micro controller utilizes a calibration procedure of the band-gap reference circuit which eliminates the need for an external reference voltage source. In order to obtain an actual measurement of the voltage supplied by band-gap reference circuit, the output voltage of band-gap reference circuit is selected, and using precision voltage measurement circuitry, the band-gap voltage is accurately measured and stored in EPROM. The absolute magnitude of the output voltage of thermistor is also measured at a predetermined temperature and also stored in EPROM. The temperature coefficient of the thermistor is calibrated at two or more various temperatures to improve accuracy.

Thus, to achieve a really high absolute accuracy and a low temperature drift, a prior art temperature compensated IC circuit needs to be calibrated at two or more distinct temperatures after packaging. However, calibrating an integrated circuit (IC) at two or more temperatures is an expensive procedure in terms of test time, test equipment and test logistics.

What is needed is to reduce the test equipment logistics and test time required to calibrate a temperature compensated IC circuit in an efficient manner.

SUMMARY OF THE INVENTION

The present invention provides a temperature stable reference in a temperature compensated integrated system on-chip. This involves use of an internal reference, an on-chip sensor measuring a parameter relative to the internal reference and an on-chip computation means, for example, a processor and an algorithm.

Briefly, the present invention achieves a very low temperature drift without adding test costs by running a high accuracy, high quality IC testing through at least two independent test sites using an on-chip reference circuit and temperature sensor (or other sensor for other drift measurements) with on-chip evaluation circuits and programming in cooperation with an external reference. The programming is a two-step algorithm stored in non-volatile memory that makes it possible to split the calibration steps at two completely independent sites. The first, initial integrated system on-chip calibration test of a condition, such as a reference voltage, is performed at a factory site, at a relatively high temperature (for instance, at 85° C.), before the integrated system on-chip is shipped to the customer. The initial calibration factory test data is stored in a non-volatile memory on the integrated system on-chip itself. On the other hand, the second integrated system on-chip calibration test is performed at a customers's site, at a local temperature (for instance, 30° C.), that is typically much lower than the first test site relatively high temperature. The customer supplies an external reference voltage source residing on the integrated system on-chip, and the second calibration test of the supplied voltage reference is performed by the integrated system on-chip itself by running the second calibration algorithm stored internally in the integrated system on-chip using test data stored in the non-volatile memory from the first calibration test. Thus, all necessary circuitry for running calibration algorithms is integrated on the chip itself, including a CPU or dedicated logic and associated circuits, or by dedicated logic. A CPU and associated circuits could be shared with other functionality of the chip. Thus, the present invention reduces the test equipment requirements by splitting the calibration steps between at least two completely independent test sites. One aspect of the present invention is directed to an apparatus for temperature calibration of an internal reference source residing on an integrated system on-chip using a temperature sensor that is on-chip. Other calibrations, such as frequency calibrations, could be carried out in the same way, with a frequency sensor carried on-chip.

In one embodiment of the present invention, the apparatus comprises: (a) the internal reference source; (b) a converter coupled to the internal reference source, and coupled to an external reference source; (c) a calibration circuit, such as a CPU or dedicated logic ("CPU" hereafter) coupled to the converter; (d) an internal non-volatile memory coupled to the calibration circuit (CPU); and (e) at least one calibration register coupled to the internal reference source, and coupled to the internal non-volatile memory. The internal non-volatile memory is configured to store a set of initial calibration data and a set of subsequent calibration data, although for other embodiments the initial calibration data is sufficient. In this embodiment, the converter is configured to convert an analog value of the external reference source to a digital value; the calibration circuit (CPU) is configured to run a calibration algorithm, stored on-chip, to calibrate the internal reference source to a first operational condition including an initial temperature (or initial pressure, or initial aging, or other parameter) at a first site, and to calibrate the internal reference source to a second operational condition including subsequent temperature (or subsequent pressure, or subsequent aging, or other parameter) by using the initial calibration data written into the internal non-volatile memory; and the calibration register is configured to collect the set of initial calibration data from the internal non-volatile memory, to upload the set of initial calibration data into the internal reference source, and to enable the calibration circuit (CPU) to run the calibration algorithm.

In another embodiment of the present invention, the apparatus further comprises an internal temperature sensor coupled to the calibration circuit (CPU). If a factory calibration is performed, the internal temperature sensor can be used to measure the actual subsequent calibration temperature using a two-step (or N-step) factory calibration algorithm. This is useful if the subsequent calibration temperature is not accurately predefined. In this embodiment, the factory calibration algorithm will need information about the actually measured temperature to find the optimal calibration data to store in non-volatile memory. When used to measure subsequent calibration temperature, one measurement is enough for each factory calibration step.

In another embodiment, a runtime calibration is performed during the normal operation after the chip has gone through the described above factory calibration operation. In this embodiment, the calibration value is dependent on the operating temperature. The operating temperature is measured regularly by the internal temperature sensor, and the runtime calibration algorithm uses the measured operating temperature and the calibration data stored in non-volatile memory to find the optimal calibration value for the real-time operating temperature.

For a factory calibration, the apparatus further comprises a supplemental external temperature sensor coupled to the calibration circuit (CPU), wherein the initial temperature is measured by the internal temperature sensor. If a factory calibration is performed, the external temperature sensor can be used to measure the actual subsequent calibration temperature using a two-step (or N-step) factory calibration algorithm. In this embodiment, the factory calibration algorithm is used to find the optimal calibration data and to store the optimal calibration data in non-volatile memory. When used to measure subsequent calibration temperature, one measurement is enough for each factory calibration step.

For a runtime calibration, performed during the normal operation after the chip has gone through the described above factory calibration operation, the calibration value is dependent on the operating temperature. The operating temperature is measured regularly by the external temperature sensor, and the runtime calibration algorithm uses the measured operating temperature and the calibration data stored in the non-volatile memory to find the optimal calibration value for the real-time operating temperature.

Another aspect of the present invention is directed to a general method of two-step calibration of an integrated system on-chip including an internal reference source.

In one embodiment, the method of the present invention comprises the following steps: (A) performing an initial calibration step of the internal reference source residing on the integrated system on-chip at a first condition; and (B) utilizing the initial calibration data obtained at the step (A) to perform at least one subsequent calibration step of the internal reference source residing on the integrated system on-chip at a second condition.

In another embodiment of the present invention, the step (A) of performing the initial calibration step of the internal reference source at the first condition further includes the steps of: (A1) performing the initial calibration step of the internal reference source at a first calibration temperature to obtain the set of initial calibration data; and (A2) storing the set of initial calibration data in an internal non-volatile memory.

In yet another embodiment of the present invention, the step (A1) of performing the initial calibration step of the internal reference source at the first calibration temperature further includes the steps of: (A1, 1) obtaining an initial nominal value of the internal reference source at the first calibration temperature at a first site; and (A1, 2) calibrating a nominal value of the internal reference source at the first calibration temperature by using the initial nominal value of the internal reference source.

In still another embodiment of the present invention, the step (B) of utilizing the set of initial calibration data to perform at least one subsequent calibration step of the internal reference source in the integrated system on-chip at the second condition further includes the steps of: (B1) loading the initial calibration data obtained at the initial calibration step at the first calibration temperature into at least one internal calibration register built in the integrated system on-chip; (B2) applying an external reference source having substantially sufficient absolute accuracy to the integrated system on-chip; (B3) converting an analog value of the external reference source to a digital value by using an internal analog-to-digital conversion circuitry built in the integrated system on-chip to enable a digital comparison of the external reference source to the internal reference source at a second calibration temperature; (B4) using an internal calibration circuit (CPU) circuitry built in the integrated system on-chip and using the set of initial calibration data to solve a calibration algorithm at the second calibration temperature; wherein the calibration algorithm determines a set of subsequent calibration data that corresponds to a lowest temperature drift of the internal reference source; and wherein the set of subsequent calibration data includes a nominal value of the internal reference source; and (B5) storing the set of subsequent calibration data in a non-volatile memory.

In a further embodiment of the present invention, the step (B4) of solving the calibration algorithm further includes the following steps: (B4, 1) determining an initial temperature drift of the absolute value of the internal reference source within a temperature range between the first calibration temperature and the second calibration temperature; (B4, 2) inputting an absolute value of the internal reference source at the second calibration temperature into the calibration algorithm; (B4, 3) inputting the initial temperature drift of the absolute value of the internal reference source into the calibration algorithm; and (B4, 4) running the calibration algorithm at the second calibration temperature to minimize an overall temperature drift of the internal reference source, and to calibrate a nominal value of the internal reference source at the second calibration temperature.

In a still further embodiment of the present invention, the step (B5) of storing the set of subsequent calibration data further includes the step (B5, 1) of storing the set of subsequent calibration data in the internal non-volatile memory. In another embodiment of the present invention, the step (B5) of storing the set of subsequent calibration data further includes the step (B5, 2) of storing the set of subsequent calibration data in an external non-volatile memory.

In another embodiment, the method of the present invention further includes the following steps: (B6) using an internal temperature sensor built in the integrated system on-chip to measure an actual value of the second temperature at the subsequent calibration step; (B7) if the actual value of the second temperature measured at the subsequent calibration step is within a temperature range specified by the calibration algorithm, inputting a fixed value of the second temperature into the calibration algorithm; and (B8) if the actual value of the second temperature measured at the subsequent calibration step is outside the temperature range specified by the calibration algorithm, inputting the measured actual value of the second temperature into the calibration algorithm. In another embodiment, the method of the present invention further includes the step (B6) of using an external temperature sensor to measure an actual value of the second temperature at the subsequent calibration step.

In yet another embodiment, the method of the present invention further includes the following steps: (B12) using the internal temperature sensor built in the integrated system on-chip to measure an actual value of the second temperature at the subsequent calibration step; or alternatively, of using an external temperature sensor to measure an actual value of the second temperature at the subsequent calibration step; (B13) optimizing the set of subsequent calibration data for the actual value of the second temperature measured at the subsequent calibration step by running the calibration algorithm; and (B14) updating at least one internal calibration register built in the integrated system on-chip with the set of optimized calibration data.

In another embodiment, the method of the present invention further includes the following step (B18) of automatically loading the plurality of internal calibration registers built in the integrated system on-chip with the calibration data obtained at the subsequent calibration step at the second calibration temperature during the integrated system on-chip system reset sequence.

In a further embodiment, the method of the present invention further includes the steps of: (B19) using the internal temperature sensor (or, alternatively, using the external temperature sensor) to substantially regularly measure and update an actual value of the second calibration temperature; and (B20) performing a runtime calibration of the internal reference source by using the calibration logic (CPU) to obtain an optimum calibration value of the internal reference source at the updated value of the second calibration temperature. Preferably, the steps (B19-B20) are repeated.

In another embodiment wherein a factory calibration is performed, the internal temperature sensor can be used to measure the actual subsequent calibration temperature using a two-step (or N-step) factory calibration algorithm. This is useful if the subsequent calibration temperature is not accurately predefined. In this embodiment, the factory calibration algorithm will need information about the actually measured temperature to find the optimal calibration data to store in non-volatile memory. When used to measure subsequent calibration temperature, one measurement is enough for each factory calibration step.

In another embodiment wherein the runtime calibration is performed during the normal operation after the chip has gone through the described above factory calibration operation, the calibration value is dependent on the operating temperature. The operating temperature is measured regularly by the internal temperature sensor, and the runtime calibration algorithm uses the measured operating temperature and the calibration data stored in the non-volatile memory to find the optimal calibration value for the real-time operating temperature.

Yet another aspect of the present invention is directed to a method for calibration of an integrated system on-chip including an internal voltage reference source.

In a further embodiment, the method of the present invention further includes the following steps: (A) performing an initial calibration step of the internal voltage reference source residing on the integrated system on-chip at a first temperature at a first site; and (B) utilizing a set of initial calibration data obtained at the step (A) to perform at least one subsequent calibration step of the internal voltage reference source residing on the integrated system on-chip at a second temperature at a second site.

In a still further embodiment, the method of the present invention further includes the steps of: (A1) performing the initial calibration step of the internal voltage reference source at the first calibration temperature to obtain the set of initial calibration data; and (A2) storing the set of initial calibration data in an internal non-volatile memory.

In a further embodiment, the method of the present invention further includes the following steps: (A1, 1) determining and loading an initial voltage temperature coefficient corresponding to the first temperature into a voltage temperature coefficient register; (A1, 2) determining and loading an initial nominal voltage value coefficient corresponding to the first temperature into a nominal voltage value coefficient register; and (A1, 3) digitally calibrating the internal voltage reference source at the first temperature by fine-tuning the nominal voltage value coefficient whereby the nominal voltage value coefficient reaches a right calibration value corresponding to the first temperature.

In a still further embodiment, the method of the present invention further includes the following steps: (B1) loading the initial voltage temperature coefficient corresponding to the first calibration temperature from the non-volatile memory into the voltage temperature coefficient register; (B2) loading the stored right calibration value of the nominal voltage value coefficient corresponding to the first calibration temperature from the non-volatile memory into the nominal voltage value coefficient register; (B3) applying an external voltage reference source having substantially sufficient absolute accuracy to the integrated system on-chip; (B4) performing a digital measurement of the external voltage reference source at the second calibration temperature by using an internal analog-to-digital conversion circuitry built in the integrated system on-chip; (B5) directly calculating a change in a value of the internal voltage reference at the second calibration temperature as compared with the value of the internal voltage reference measured at the first calibration temperature thus determining a value of a temperature drift in the value of the internal voltage reference; (B6) finding a calibration value of a voltage temperature coefficient corresponding to the second calibration temperature by using the value of the temperature drift in the value of the internal voltage reference; (B7) storing the calibration value of the voltage temperature coefficient corresponding to the second calibration temperature in the non-volatile memory; (B8) digitally calibrating the internal voltage reference at the second calibration temperature by fine-tuning the nominal voltage value coefficient whereby the nominal voltage value coefficient reaches a calibration value corresponding to the second temperature; and (B9) storing the calibration value of the nominal voltage value coefficient corresponding to the second temperature in the non-volatile memory.

In a further embodiment, the method of the present invention further includes the following steps: (B6, 1) determining a number of incremental or decremental steps in order to find a right calibration value for the voltage temperature coefficient corresponding to the second calibration temperature; and (B6, 2) using the number of incremental or decremental steps in order to find a right calibration value for the voltage temperature coefficient corresponding to the second calibration temperature within a single iteration procedure.

In a still further embodiment, the method of the present invention further includes the step (B7, 1) of storing the calibration value of the voltage temperature coefficient corresponding to the second calibration temperature in the internal non-volatile memory. In one embodiment, the method of the present invention further includes the step (B9, 1) of storing the calibration value of the nominal voltage value coefficient corresponding to the second calibration temperature in the internal non-volatile memory. In one embodiment, the method of the present invention further includes the step (B7, 2) of storing the calibration value of the voltage temperature coefficient corresponding to the second calibration temperature in the external non-volatile memory. In one embodiment, the method of the present invention further includes the step (B9, 2) of storing the calibration value of the nominal voltage value coefficient corresponding to the second calibration temperature in the external non-volatile memory.

In another embodiment, the method of the present invention further includes the step (B10) of using an internal temperature sensor (or, the step B11 of using an external temperature sensor) to substantially regularly measure and update an actual value of the second calibration temperature. Preferably, steps (B1-B10) are repeated.

In yet another embodiment wherein a factory calibration is performed, the internal temperature sensor can be used to measure the actual subsequent calibration temperature using a two-step (or N-step) factory calibration algorithm. This is useful if the subsequent calibration temperature is not accurately predefined. In this embodiment, the factory calibration algorithm will need information about the actually measured temperature to find the optimal calibration data to store in non-volatile memory. When used to measure subsequent calibration temperature, one measurement is enough for each factory calibration step.

In still another embodiment, the runtime calibration is performed during the normal operation after the chip has gone through the described above factory calibration operation. In this embodiment, the calibration value is dependent on the operating temperature. The operating temperature is measured regularly by the internal temperature sensor, and the runtime calibration algorithm uses the measured operating temperature and the calibration data stored in non-volatile memory to find the optimal calibration value for the real-time operating temperature.

In yet another embodiment, the method of the present invention further includes the step (B14) of automatically initializing the integrated system on-chip by loading the stored right calibration value of the voltage temperature coefficient corresponding to the second temperature into the voltage temperature coefficient register and by loading the stored right calibration value of the nominal voltage value coefficient corresponding to the second temperature into the nominal voltage value coefficient register.

Yet one more aspect of the present invention is directed to a method for calibration of an integrated system on-chip including an internal time reference source.

In a further embodiment, the method of the present invention comprises the following steps: (A) performing an initial calibration step of the internal time reference source residing on the integrated system on-chip at a first condition; and (B) utilizing a set of initial calibration data obtained at the step (A) to perform at least one subsequent calibration step of the internal time reference source residing on the integrated system on-chip at a second condition.

In a still further embodiment, the method of the present invention comprises the following steps: (A1) performing the initial calibration step of the internal time reference source at a first calibration temperature to obtain the set of initial calibration data; an (A2) storing the set of initial calibration data in an internal non-volatile memory built in the integrated system on-chip.

In another embodiment, the method of the present invention comprises the following steps: (A1, 1) determining an initial value of the internal time reference source; and (A1, 3) digitally calibrating the internal time reference source at the first temperature.

In yet another embodiment, the method of the present invention comprises the following steps: (B1) loading the initial calibration data corresponding to the first calibration temperature from the non-volatile memory into at least one internal calibration register built in the integrated system on-chip; (B2) applying an external time reference source having substantially sufficient absolute accuracy to the integrated system on-chip; (B3) performing a digital measurement of the external time reference source at the second calibration temperature by using an internal analog-to-digital conversion circuitry built in the integrated system on-chip; (B4) directly calculating a change in a value of the internal time reference at the second calibration temperature as compared with the value of the internal time reference measured at the first calibration temperature thus determining a value of a temperature drift in the value of the internal time reference; (B5) finding a calibration value of a time reference temperature coefficient corresponding to the second calibration temperature by using the value of the temperature drift in the value of the internal time reference; (B6) storing the calibration value of the time reference temperature coefficient corresponding to the second calibration temperature in the non-volatile memory; (B7) digitally calibrating the internal time reference at the second calibration temperature by fine-tuning a nominal internal time reference coefficient, whereby the nominal internal time reference coefficient reaches a calibration value corresponding to the second temperature; and (B8) storing the calibration value of the nominal internal time reference coefficient corresponding to the second temperature in the non-volatile memory.

In a further embodiment, the method of the present invention comprises the following steps: (B2, 1) applying an external pulse train; and (B3, 1) measuring a period of the external pulse train by using an internal timer built in the integrated system on-chip. In this embodiment, the internal timer counts a number of on-chip clock periods that corresponds to the period of the external pulse train; and the number of counted clock periods gives a relationship between the external time reference and the internal time reference.

In another embodiment, the method of the present invention comprises the following steps: (B2, 2) applying an external crystal or ceramic resonator to an internal oscillator built in the integrated system on-chip; (B3, 2) measuring a period of the external crystal or ceramic resonator by clocking a first external timer on the external crystal or ceramic resonator, and by clocking a second internal timer on the internal oscillator built in the integrated system on-chip; and (B3, 3) comparing a number of counts counted by the first external timer and counted by the second internal timer to obtain the relationship between the external time reference and the internal time reference.

The invention has the following advantages: Reduced total test time because both sites will run its own tests independently of the calibration requirement. A chip manufacturer very often performs its packaged part test at high temperature, and the system manufacturer performs its tests typically at room temperature. By exploiting this fact, the chipmaker does not need to have an expensive second test insertion at room temperature only for calibration reasons.

A system manufacturer can optimize the algorithm to its own needs. For instance, with a band-gap gap voltage reference, the temperature coefficient may be zero at a certain temperature and temperature drift will increase when moving away from this temperature. With the present invention, the calibration algorithm can be extended to minimize the temperature drift in different temperature ranges selected by the system manufacturer.

Simple test logistics and reduced costs occur because the chip itself keeps track of all necessary calibration data and the correct calibration algorithm is built into the chip.

DETAILED DESCRIPTION OF THE PREFERRED EMBODIMENT

Figure 1:
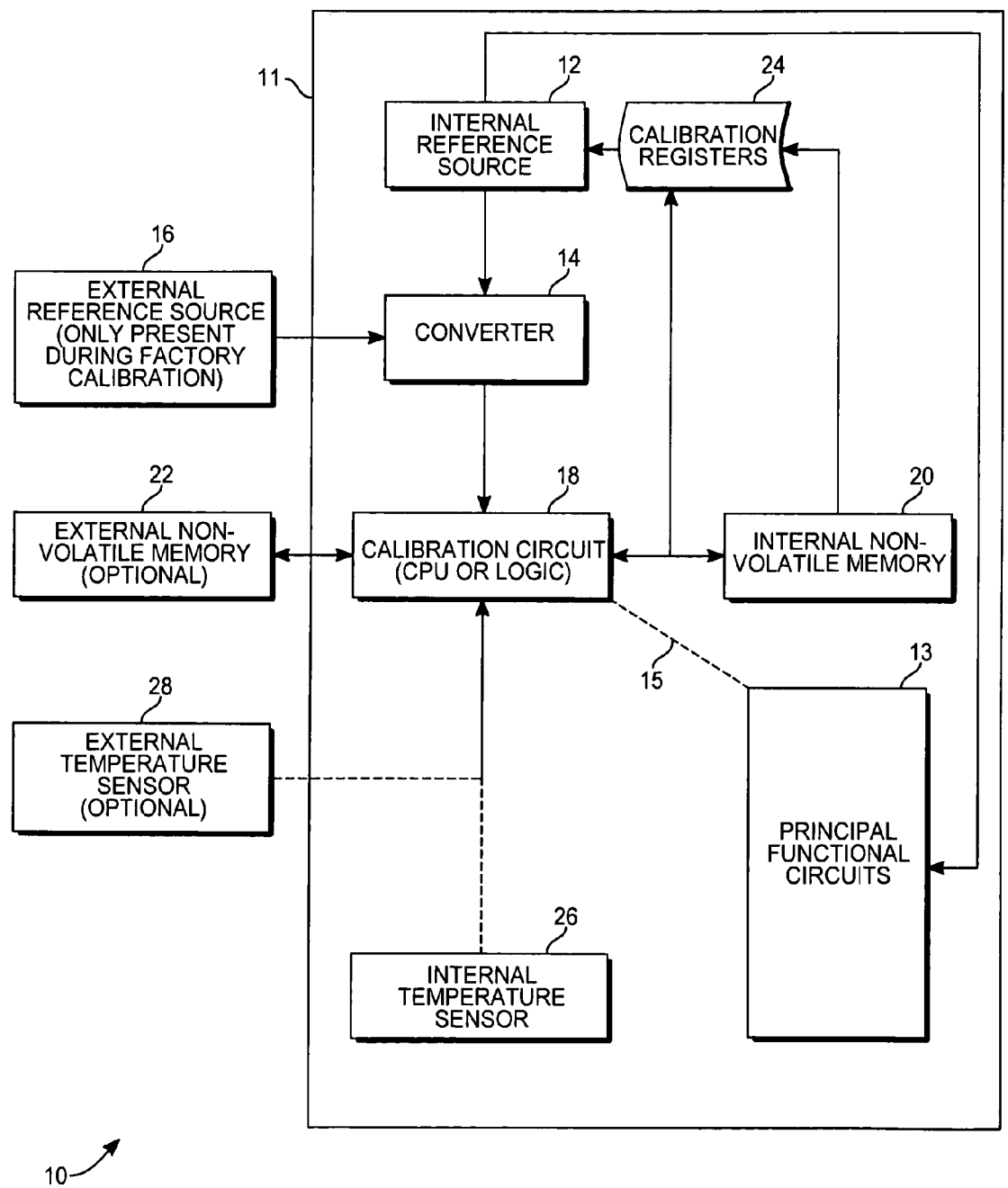
FIG. 1 is a plan of an integrated system with an internal reference source, and the calibration method of the present invention.

FIG. 1 depicts an apparatus 10 for temperature calibration of an internal reference source residing on an integrated system on the integrated circuit chip 11. The calibration method of the present invention is aimed to improve the temperature stability of the integrated system with an internal reference source 12 and an internal sensor 26. By integrated system here we mean a true system on-chip design, or a system with more than one chip integrated in the same package.

A converter 14 is coupled to the internal reference source 12. Converter 14 is a generic converter that converts the reference value to a digital value. In a case of an internal analog voltage reference, the converter is an analog-to-digital converter (ADC). In a case of an internal time reference, i.e. an oscillator, the converter is a time counter. The internal reference source is calibrated with respect to some parameter, such as temperature, measured by an on-chip sensor, such as a temperature variable resistor. Other parameters, such as frequency, can also be used.

The external reference source 16 is used only during factory calibration.

Referring still to FIG. 1, the apparatus 10 also includes an integrated circuit chip 11 having an internal non-volatile memory 20 coupled to the calibration circuit (CPU) 18. The internal non-volatile memory 20 can be implemented by using the internal flash and/or EEPROM memory. The calibration circuit (CPU) 18 solves a calibration algorithm, and also performs an optional runtime calibration. The calibration circuit (CPU) 18 can be implemented by using dedicated hardware, like an ASIC, or FPGA, or a dedicated CPU and associated hardware and a stored algorithm, stored in the internal non-volatile memory 20, or a shared CPU indicated by dashed line 15. In the latter case, the shared CPU is in the principal functional circuit 13 of the integrated circuit chip 11.

The chip 11 has at least one calibration register 24 coupled to the internal reference source 12, and coupled to the internal non-volatile memory 20. The calibration registers are dedicated registers that include the calibration values. The calibration registers 24 can upload a set of calibration data from the calibration circuit (CPU), or directly from the internal non-volatile memory 20. The internal reference source 12 is the reference circuit that is configured to be calibrated by using the calibration method of the present invention. The internal reference values are affected by the calibration register values. The calibration algorithm determines the calibration values that will give the lowest temperature drift and the best nominal value over the temperature range. Other functionality of the chip 11, typically the principal functionality, perhaps a memory array or CPU or any principal functional circuits 13 are not shown.

In one embodiment of the present invention, referring still to FIG. 1, the chip 11 includes an internal temperature sensor 26 coupled to the calibration logic (CPU) 18. In this embodiment, the internal temperature sensor 26 is configured to substantially regularly measure the subsequent temperature; so that the actual temperature is used for calibration purposes.

Indeed, the on-chip calibration circuit (CPU) 18 is configured to substantially regularly run the on-chip calibration algorithm based on the updated (actual) value of subsequent temperatures in order to regularly calibrate the internal reference source 12 according to the updated subsequent actual temperatures.

The internal temperature sensor 26 can be used in two ways. First, it can be used to determine the actual temperature at the second or later calibration step.

More specifically, in one embodiment, if a factory calibration is performed, the internal temperature sensor 26 can be used to measure the actual subsequent calibration temperature using a two-step (or N-step) factory calibration algorithm. This is useful if the subsequent calibration temperature is not accurately predefined. In this embodiment, the factory calibration algorithm will need information about the actually measured temperature to find the optimal calibration data to store in non-volatile memory. When used to measure subsequent calibration temperature, one measurement is enough for each factory calibration step.

Secondly, the temperature sensor 26 can enable a run-time calibration, where the software checks the temperature regularly and updates the calibration registers 24 with values that are optimal for the measured temperature.

More specifically, the runtime calibration is performed during the normal operation after the chip 11 has gone through the described above factory calibration operation. In this embodiment, the calibration value is dependent on the operating temperature. The operating temperature is measured regularly by the internal temperature sensor 26, and the runtime calibration algorithm uses the measured operating temperature and the calibration data stored in non-volatile memory to find the optimal calibration value for the real-time operating temperature.

The external temperature sensor 28 can be employed to perform the same functions as the internal temperature sensor 20, but an internal sensor is an important component of the present invention. Other sensors, besides temperature, could be used when measuring reference quantities relative to other conditions.

The apparatus 10 can also employ an external non-volatile memory 22 instead of internal non-volatile memory 20 to perform the same functions as the internal memory 20 performs, although on-chip circuits are preferred.

Another aspect of the present invention is directed to a general method of two-step calibration of the integrated system on-chip 10 of FIG. 1 including the internal reference source 12. In one embodiment, the method of the present invention comprises the following steps: (A) performing an initial calibration step of the internal reference source 12 residing on the integrated system on-chip 10 at a first condition; and (B) utilizing a set of initial calibration data obtained at the step (A) to perform at least one subsequent calibration step of the internal reference source 12 residing on the integrated system on-chip 10 at a second condition.

The first and second conditions are generally external slow varying parameters, like temperature, humidity, components aging, etc., so long as on-chip sensors exist. For the purposes of the present discussion, the first and second conditions are assumed to be the first (initial) and the second (subsequent) temperatures, respectively, and the reference quantity is a reference voltage.

Figure 2:
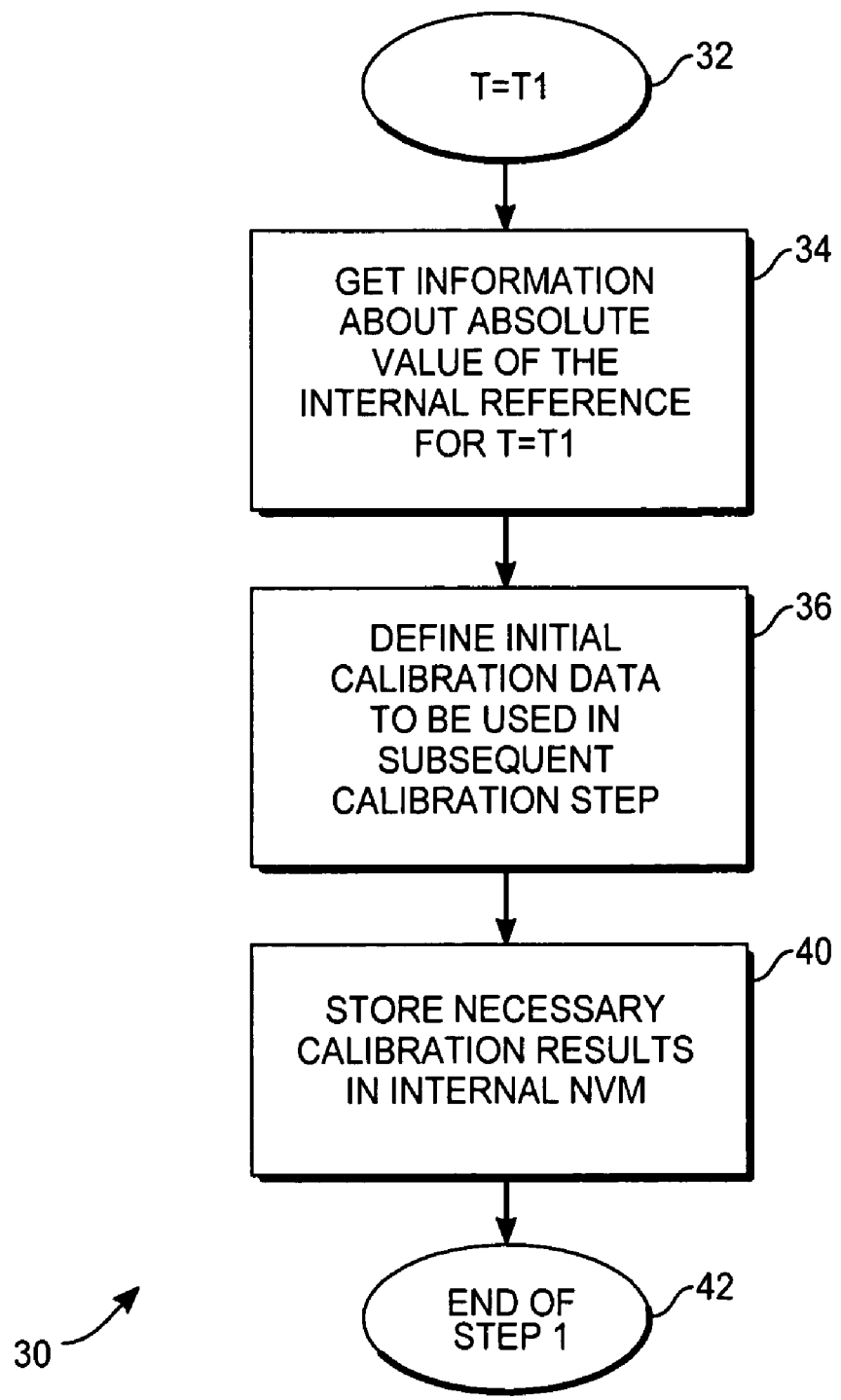
FIG. 2 is a flow chart of the first calibration step of the system of FIG. 1 at a high temperature at a chip manufacture site.

As depicted in the flow chart 30 of FIG. 2, the step (A) of performing the initial calibration step of the internal reference source (voltage) at the first condition (temperature) further includes the following steps of: (34, 36) performing the initial calibration step of the internal reference source 12 at a first calibration temperature to obtain the set of initial calibration data; and (step 40) storing the set of initial calibration data in the internal non-volatile memory 20 (of FIG. 1). The chip manufacturer performs the first (initial) calibration step at a high temperature. This calibration measurement gives no new information about the temperature drift of the internal reference source 12 (of FIG. 1). Thus, only the nominal value of the internal reference source is calibrated. The calibration results are written into the internal non-volatile memory 20.

In the step of performing the initial calibration step of the internal reference source at the first calibration temperature further includes the steps of: (34) obtaining an initial nominal value of the internal reference source at the first calibration temperature at the first site; and (step 36) calibrating a nominal value of the internal reference source at the first calibration temperature by using the initial nominal value of the internal reference source, as depicted in the flow chart 30 of FIG. 2.

Figure 3:
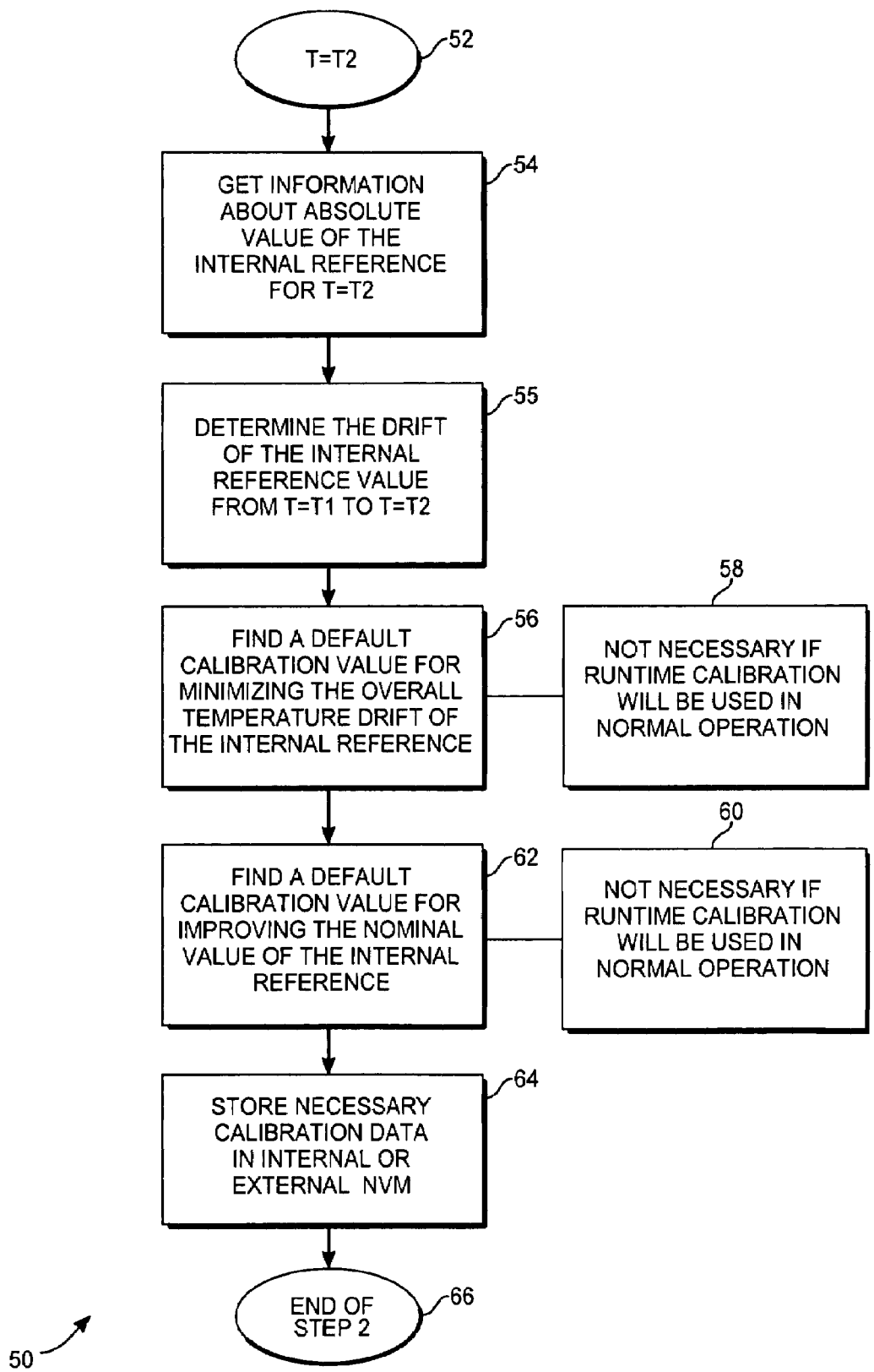
FIG. 3 is a flow chart of the second calibration step of the system of FIG. 1 at a typical temperature.

As depicted in the flow chart 50 of FIG. 3, the step (B) of utilizing the set of initial calibration data to perform at the second calibration step of the internal reference source 12 in the integrated system on-chip 10 (of FIG. 1) at the second calibration temperature further includes the following steps.

The initial calibration data obtained at the initial calibration step at the first calibration temperature is loaded from the internal non-volatile memory 20 into the internal calibration registers 24 of FIG. 1. The customer performs this calibration steps close to typical operating temperature.

The next step 54 of FIG. 3 includes several sub steps: (1) an external reference source 16 having substantially sufficient absolute accuracy is applied to the integrated system on-chip 10; and (2) the converter 14 converts an analog value of the external reference source 16 to a digital value. In this way the absolute value of the internal reference source 12 is found at the current (second) calibration temperature. Also, the temperature drift from the prior (first) calibration temperature of the internal reference source 12 is found.

At the next step 56, the internal calibration circuit (CPU) block 18 solves the calibration algorithm at the second calibration temperature. The resulting calibration data is used to minimize the overall temperature drift of the internal reference source at step 56, and to improve the nominal value of the internal reference source at typical operating temperature (step 62). In one embodiment of the present invention, the obtained calibration data is also stored in the internal non-volatile memory 20 (step 64). In another embodiment of the present invention, the obtained calibration data is also stored in the external non-volatile memory 22 (step 64).

Figure 4:
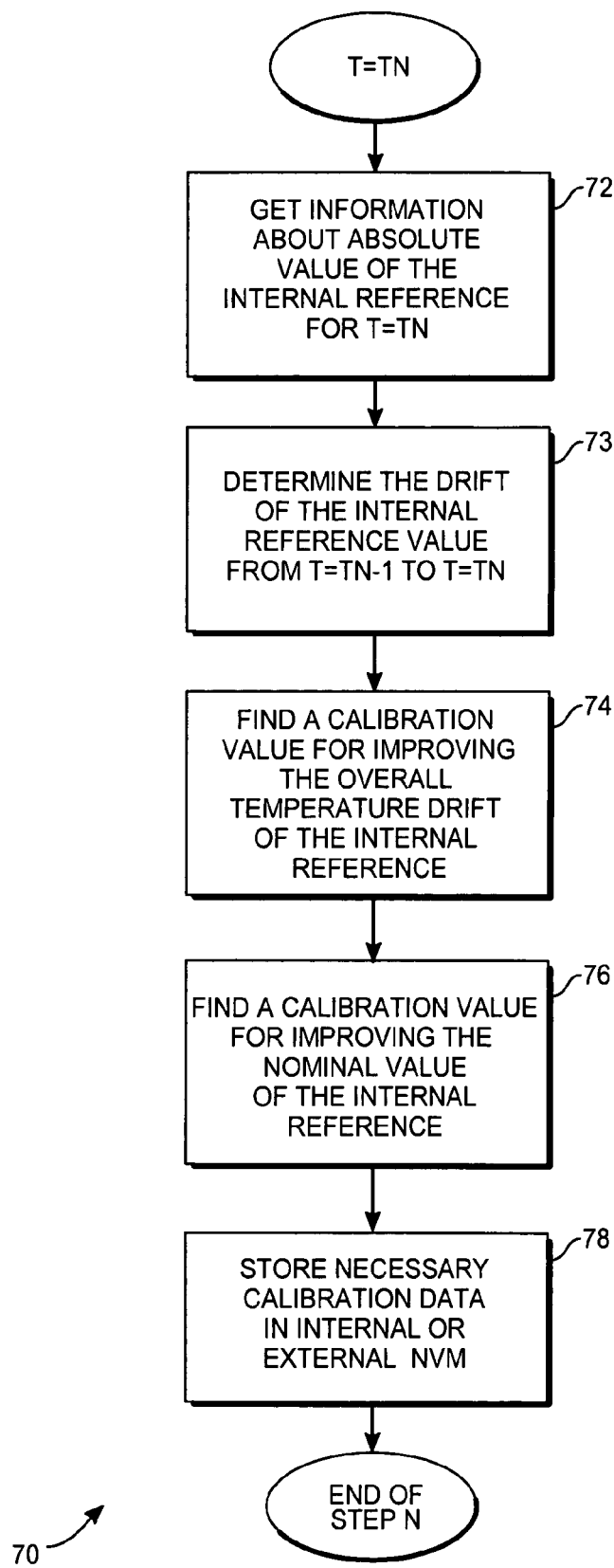
FIG. 4 is a flow chart of a further calibration step of the system of FIG. 1 at a subsequent operating temperature.

If even better temperature stability is wanted, further calibration steps, as depicted in the flow chart 70 FIG. 4, should be performed. This procedure is the same as the calibration procedure disclosed above in conjunction with discussion of the flow chart 50 of FIG. 3. For each new calibration temperature, new information about the temperature drift of the internal reference source is achieved (steps 74 and 76) and stored (step 78) preferably in internal non-volatile memory. This information is used to further improve the temperature stability of the internal reference source 12 of FIG. 1. Steps 74 and 76 are not necessary if runtime calibration is used in normal operation. After calibrating the integrated system on-chip 10 (of FIG. 1), as it is disclosed above, a set of default calibration values are defined and stored in the internal non-volatile memory. These values are automatically loaded into the calibration registers 24 of FIG. 1, as depicted in step 82 of the flow chart 80 of FIG. 5. If runtime calibration is used, indicated by block 84, the default calibration values need not be defined, indicated by block 85. Calibration values ensure that the internal reference has an accurate nominal value and a very low temperature drift.

The runtime calibration (block 84 of flow chart 80 of FIG. 5) can be used to further improve the temperature stability of the internal reference circuit 12 of FIG. 1. Runtime calibration is not a necessary feature of the invention. In this embodiment, the temperature is measured substantially regularly (step 86) by using the internal temperature sensor 26 of FIG. 1, or by using the external temperature sensor 28 of FIG. 1. The calibration circuit (CPU) 18 of FIG. 1 updates the calibration registers (step 88) with a new set of calibration data that are optimal for the updated actual temperature, if the new calibration value is required. On the other hand, if the temperature change does not affect the calibration values, the calibration logic waits (block 89) for the new temperature data.

The prior art technique to get a temperature stable reference in an integrated circuit (IC) is to use a band-gap reference. To achieve a really high absolute accuracy and a low temperature drift, the band-gap circuit needs to be calibrated at two or more distinct temperatures after packaging. However, calibrating at two or more temperatures is expensive in terms of test time, test equipment and test logistics.

Figure 6:
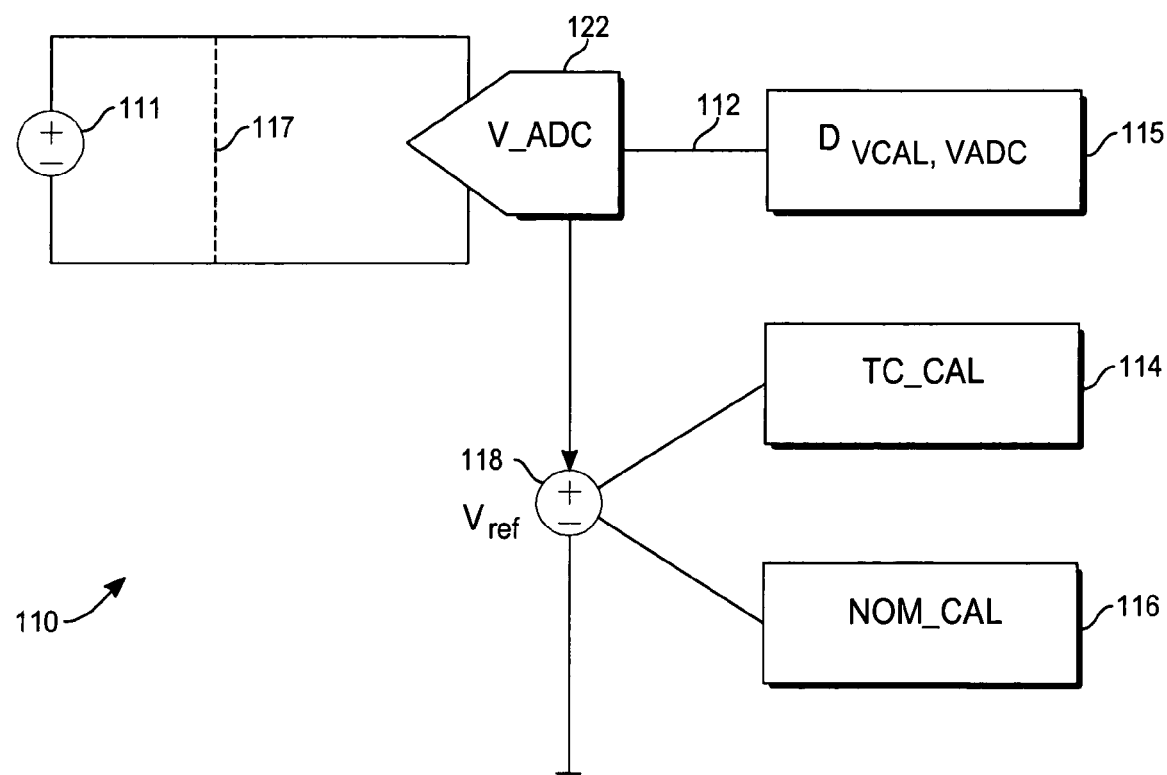
FIG. 6 is a schematic diagram of a test set-up for calibration of system of FIG. 1 having an internal voltage reference source according to the present invention.

To facilitate a factory calibration at high temperature, the test equipment should be able to supply a very accurate voltage at the cell terminals as illustrated in the test set-up 110 in FIG. 6. More specifically, an accurate voltage reference source should have the following parameters: 1.100V at 0.1% accuracy after calibration (at 2 mV calibration steps).

For example, the voltage reference operating circuits MAX6341 could be used as an external voltage reference. External circuitry is to the left of dashed line 117. Indeed, a typical prior art MAXIM external voltage reference operating circuit (like MAX6325, MAX6341, or MAX6350) could be used as a reference circuit 111 of FIG. 6. The MAX6325, MAX6341, MAX6350 are low-noise, precision voltage references with extremely low, 0.5 ppm/° C. typical temperature coefficients and excellent, 0.02% initial accuracy. These devices feature buried-Zener technology for lowest noise performance. Load-regulation specifications are guaranteed for source and sink currents up to 15 mA. Excellent line and load regulation and low output impedance at high frequencies make them ideal for high-resolution data-conversion systems up to 16 bits. The MAX6325 is set for a 2.500V output, the MAX6341 is set for a 4.096V output, and the MAX6350 is set for a 5.000V output. All three provide for the option of external trimming and noise reduction. The MAX6325/MAX6341/MAX6350 voltage reference operating circuits are manufactured by Maxim Integrated Products, 120 San Gabriel Drive, Sunnyvale, Calif. 94086 USA.

An internal low power band-gap voltage reference should provide integrated system on-chip (like an ATmega406 chip) with an accurate on-chip voltage reference $V_{REF}$ of 1.100V. This voltage reference is used as reference for the on-chip voltage regulator, the V-ADC and the CC-ADC. The reference to the ADCs uses a buffer with external decoupling capacitor to enable excellent noise performance with minimum power consumption. The voltage reference $V_{REF\_P}/V_{REF\_N}$ to the CC-ADC is scaled to match the full-scale requirement at the current sense input pins. This configuration also enables concurrent operation of both V-ADC and CC-ADC.

To assure ultra low temperature drift after factory calibration, a chip such as the ATmega406 would feature a two-step calibration algorithm. The first step is performed at 85° C. and the second at room temperature. The first calibration at 85° C. is stored in flash memory at a first location, such as the chip manufacturing location. The second step is a calibration that the customer can easily implement in its test flow. It requires only an accurate input voltage and a stable room temperature. Temperature drift after this optional calibration is assured by design and characterization to be less than 80 ppm (parts per million)/° C. from 0° C. to 60° C. and 100 ppm/° C. from 0° C. to 85° C. A calibration register can also be altered at runtime to implement temperature compensation in software. Very high accuracy for any temperatures inside the temperature range can thus be achieved at the cost of extra calibration steps. However, in the case of a reference value that is a linear function of temperature, two calibration steps are enough to have a full benefit of runtime calibration.

An ATmega406 chip would have an on-chip temperature sensor for monitoring the die temperature. A voltage proportional-to-absolute-temperature, $V_{PTAT}$, is generated in the voltage reference circuit and connected to the multiplexer (not shown) at the V-ADC input. This temperature sensor can be used for runtime compensation of temperature drift in both the voltage reference and the on-chip oscillator (not shown). To get the absolute temperature in degrees Kelvin, the measured $V_{PTAT}$ voltage should be scaled with the factory calibration value stored in VPTAT calibration register.

Referring still to FIG. 6, in one embodiment of the present invention, the voltage reference VREF 118 includes two different calibration registers: TC_CAL 114 and NOM_CAL 116. The TC_CAL register 114 is used to adjust the temperature gradient of VREF 118. In one embodiment of the present invention, TC_CAL register is configured to store an 8 bits word that has 9 different possible values: 00000000, 00000001, 00000011, 00000111, . . . 11111111. The NOM_CAL register 116 is used for fine-tuning of the nominal voltage at the test temperature. In one embodiment of the present invention, NOM_CAL register 116 is configured to store a 6 bit word that is binary coded, resulting in 63 calibration steps. In one embodiment of the present invention, the voltage calibration step size is preferably 2 mV.

To tune the "TC_CAL" value stored in the TC_CAL register 114, the integrated system on-chip has to be calibrated at two different temperatures. In one embodiment of the present invention, the calibration values found at the second calibration temperature, "TC_CAL_T2" and "NOM_CAL_T2" are stored in a flash memory (not shown) and loaded into the calibration registers TC_CAL 114 and NOM_CAL 116 during initialization of the chip. The calibration algorithm of the present invention utilizes the internal on-chip digital (D) voltage value V_ADC on line 112 (of FIG. 6) to find the right calibration values for temperature coefficient, TC_CAL, and nominal coefficient, NOM_CAL.

Figure 7:
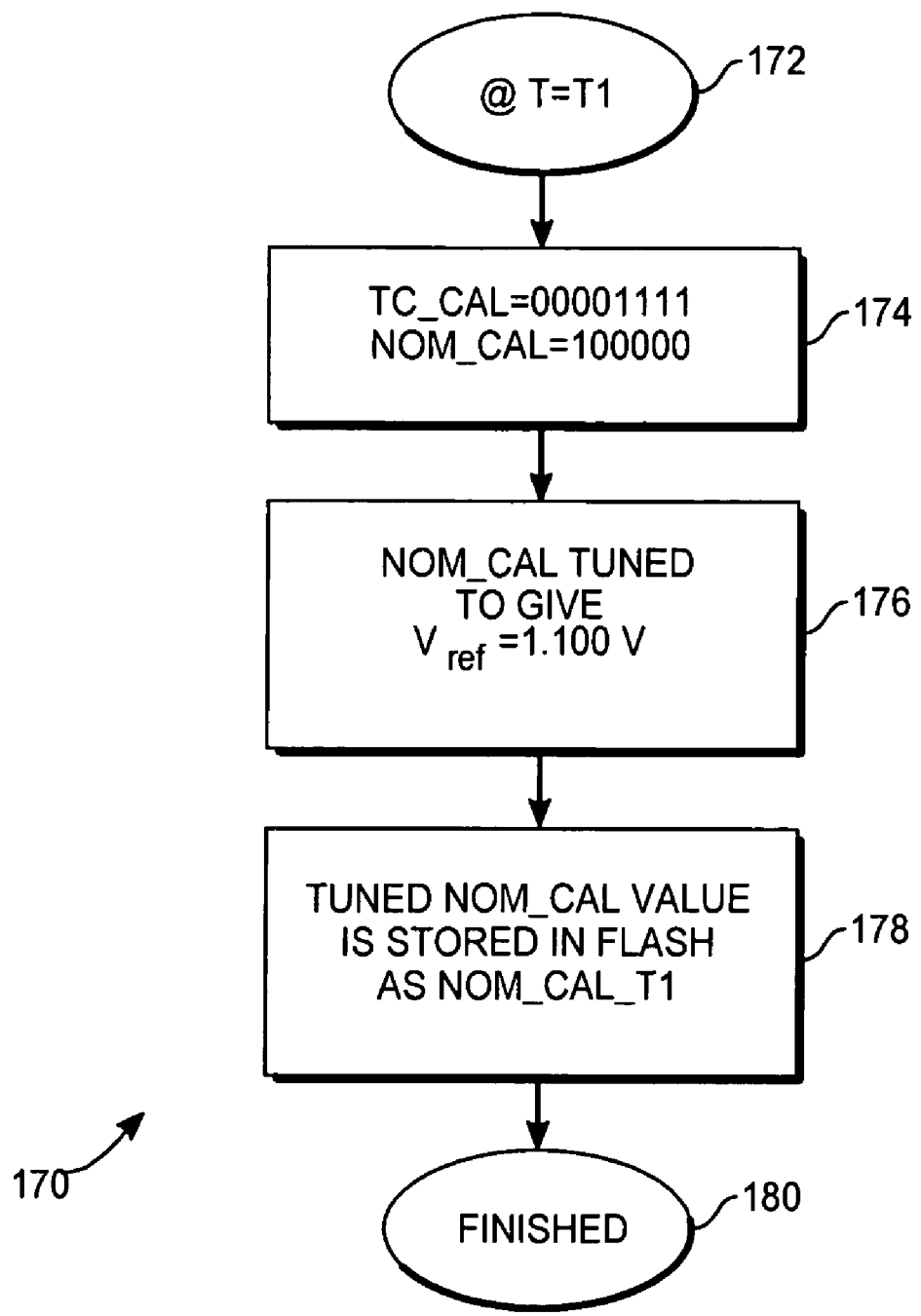
FIG. 7 is a flow chart of the initial calibration algorithm used for the initial calibration of the integrated system on-chip of FIG. 6 having the internal voltage reference source at a relatively high temperature T1 at a first site.

In FIG. 7 the initial calibration algorithm 170 is used for the initial calibration of the integrated system on-chip at high temperature T1 (block 172) at the factory. At the first step 174 of the initial calibration algorithm, an initial voltage temperature coefficient TC_CAL corresponding to the first temperature is determined and is loaded into a voltage temperature coefficient register 114 (of FIG. 6). At the same step 174 of the flow chart 170 (of FIG. 7), an initial nominal voltage value coefficient NOM_CAL corresponding to the first temperature T1 is determined and is loaded to a nominal voltage value coefficient register 116 (of FIG. 6). At the next step 176, the voltage reference level VREF (118 of FIG. 6) is digitally calibrated at the first temperature T1 by fine-tuning the nominal voltage value coefficient NOM_CAL, and the calibration value NOM_CAL_T1 is stored (at step 178) in the internal non-volatile memory (20 of FIG. 1), for instance, in the flash memory, until finished (block 180).

When the integrated system on-chip is calibrated at only one temperature T1, one cannot calibrate for variations in the temperature gradient of the process. To assure an absolute accuracy over temperature in this case, one needs to characterize the voltage reference in the actual process that will be used for an integrated system on-chip. For the temperature range 0-60° C. one can estimate that accuracy over temperature when the calibration is performed only at one temperature is somewhere between 0.5% and 1.0%. One should monitor the temperature drift of the process to get 0.5% guarantied accuracy after calibration at only one temperature is performed. To increase the calibration accuracy, a second calibration should be performed. For example, the first calibration is performed at 85° C. in Atmel factory test, and the second calibration takes place at 30° C. in a customer factory test. In this example, the estimated calibration accuracy is 0.25%.

The second calibration step is as follows: By loading the NOM_CAL_T1 coefficient found at the first temperature (T1), one can use the same default TC_CAL and do an ADC conversion of the known external voltage reference. We can then directly calculate the change in the internal voltage reference compared to the first calibration temperature. This temperature drift directly dictates how many steps the TC_CAL coefficient should be incremented or decremented. So after one measurement of the external voltage reference, the correct TC_CAL coefficient is found and stored as TC_CAL_T2. After the TC_CAL coefficient is found as explained above, the NOM_CAL coefficient is tuned to give the wanted nominal voltage at test temperature T2 and with TC_CAL=TC_CAL_T2. Changing the NOM_CAL has little influence on the temperature drift so that the TC_CAL_T2 coefficient is still valid after tuning NOM_CAL.

Figure 8:
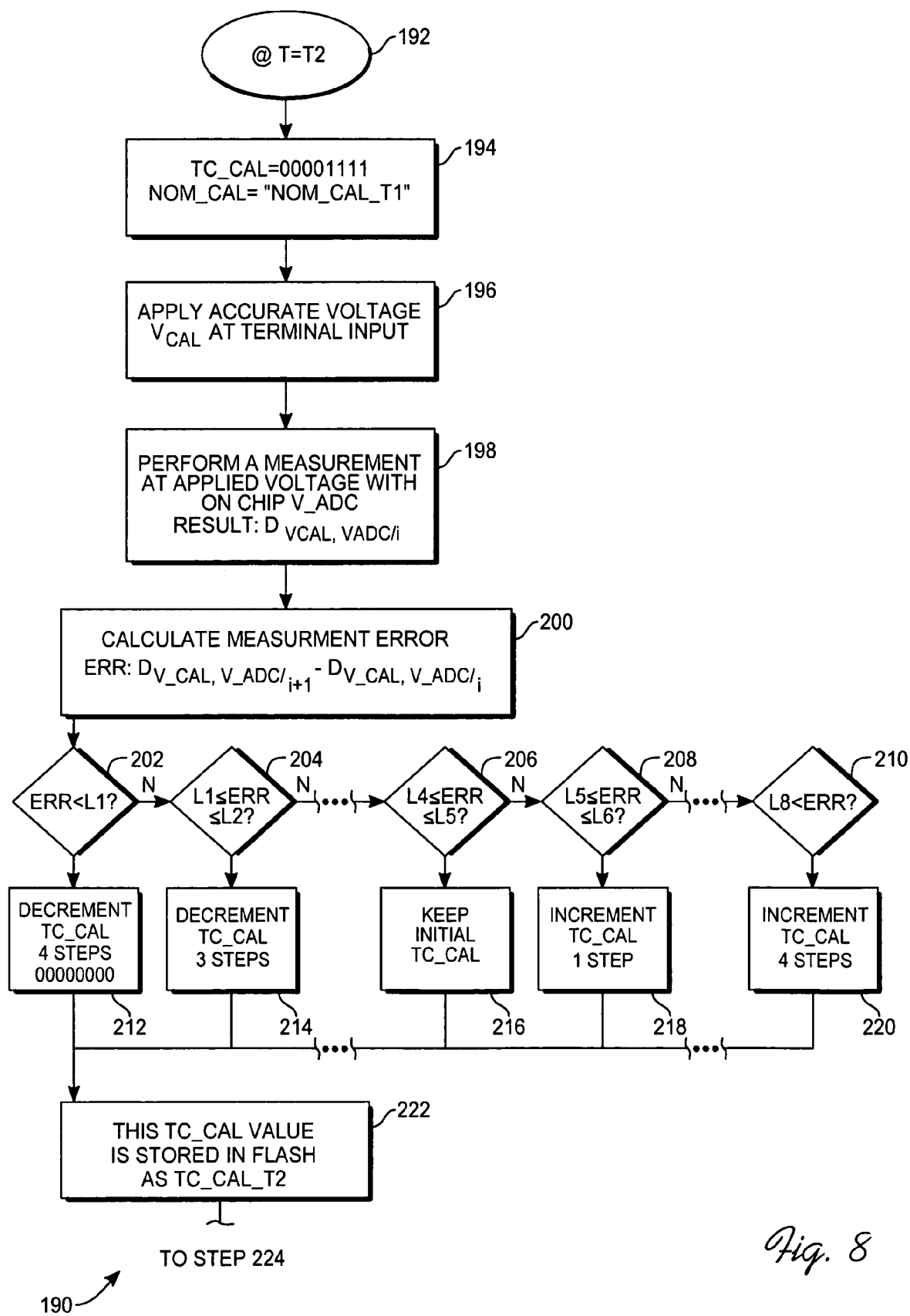
FIG. 8 is a flow chart of the second calibration algorithm of the integrated system on-chip of FIG. 6 having the internal voltage reference source at a second site at the site's temperature T2 that is lower than the first high temperature at the first site.

In FIG. 8, flow chart 190 illustrates an optional alternate way of performing the second calibration of the internal voltage reference (12 of FIG. 1) residing on an integrated system on-chip 10 (of FIG. 1) at the second temperature T=T2. As described, the second calibration is performed at a customer's site at the site's temperature T2 (block 192). The site's temperature T2 is lower than the first temperature at the factory's site T1=85° Celsius.

Referring still to FIG. 8, at the step 194 of the flow chart 190, the initial voltage temperature coefficient TC_CAL_T1 corresponding to the first temperature that was used for the initial calibration (flow chart 170 of FIG. 6) and stored in the internal flash memory after the initial calibration was performed, is loaded into the voltage temperature coefficient register 114 (of FIG. 6). At the same step 194 of the flow chart 190, the value of NOM_CAL_T1 that was found and stored in the flash memory after the initial calibration was performed (according to flow chart 170 of FIG. 6) is loaded into the NOM_CAL register 116 (of FIG. 6).

Referring still to FIG. 8, at step 196 a predefined analog accurate reference voltage VCAL is applied at the integrated system on-chip terminal input (lines 117-119 of FIG. 6). In one embodiment of the present invention, a predefined analog accurate reference voltage VCAL can be supplied by using a MAXIM voltage reference operating circuit 111 of FIG. 6. At the next step 198 a digital measurement corresponding to the second temperature of the predefined analog reference voltage VCAL is performed by using an internal on-chip analog-to-digital voltage conversion operation V-ADC 122 (of FIG. 6). The obtained value of the digital voltage reference $D_{VCAL,VADC\,(I)}$ (115 of FIG. 6) corresponds to the second temperature T2.

Referring still to FIG. 8, at the step 200, a measurement error ERR of the measured digital voltage value of the predefined analog reference voltage corresponding to the second temperature is calculated as follows:

$$ERR = D_{VCAL,VADC\,(I)} - D_{VCAL,VADC\,(I-1)}.$$ (Eq. 1)

In one embodiment of the present invention, at step 200, the measurement error ERR (Eq. 1) is tested against a plurality of test conditions (Test 202-Test 210):

| | |
|---|---|
| ERR < L1; | (Test 202) |
| L1 ≦ ERR < L2; | (Test 204) |
| L2 ≦ ERR < L3; | (Not shown) |
| L3 ≦ ERR < L4; | (Not shown) |
| L4 ≦ ERR < L5; | (Test 206) |
| L5 ≦ ERR < L6; | (Test 208) |
| L6 ≦ ERR < L7; | (Not shown) |
| L7 ≦ ERR < L8; | (Not shown) |
| L8 < ERR. | (Test 210) |

One of the test conditions (Test 202-Test 210) that proves true for the value of Err (Eq. 1) allows one to determine the number of incremental or decremental steps, and therefore, the calibration value for the voltage temperature coefficient TC_CAL corresponding to the second temperature T2. More specifically, one can find the calibration value for the voltage temperature coefficient TC_CAL corresponding to the second temperature T2 by performing one of the following optional steps, although the calibration value can be found in other ways:

Step 212 decrementing the value of the voltage temperature coefficient TC_CAL by doing 4 decrementing steps (not shown), if the calculated at the step 200 value of error ERR satisfies the test condition (Test 202); or Step 214 decrementing the value of the voltage temperature coefficient TC_CAL by doing at 3 decrementing steps (not shown), if the calculated at the step 200 value of error ERR satisfies the test condition (Test 204); or Step 216 the value of the voltage temperature coefficient TC_CAL is kept the same, if the calculated at the step 200 value of error satisfies the test condition (Test 206); or Step 218 incrementing the voltage temperature coefficient TC_CAL at a single incremental step (not shown), if the calculated at the step 200 value of error satisfies the test condition (Test 208); or Step 220 incrementing the initial voltage temperature coefficient TC_CAL for 4 further incremental steps (not shown), if the calculated at the step 200 value of error satisfies the test condition (Test 210).

Referring still to FIG. 8, at the subsequent step 222, the found voltage temperature coefficient TC_CAL_T2 corresponding to the second temperature T2 is stored in the non-volatile memory. In one embodiment of the present invention, the voltage temperature coefficient TC_CAL_T2 corresponding to the second temperature T2 is stored in the flash non-volatile memory.

Figure 9:
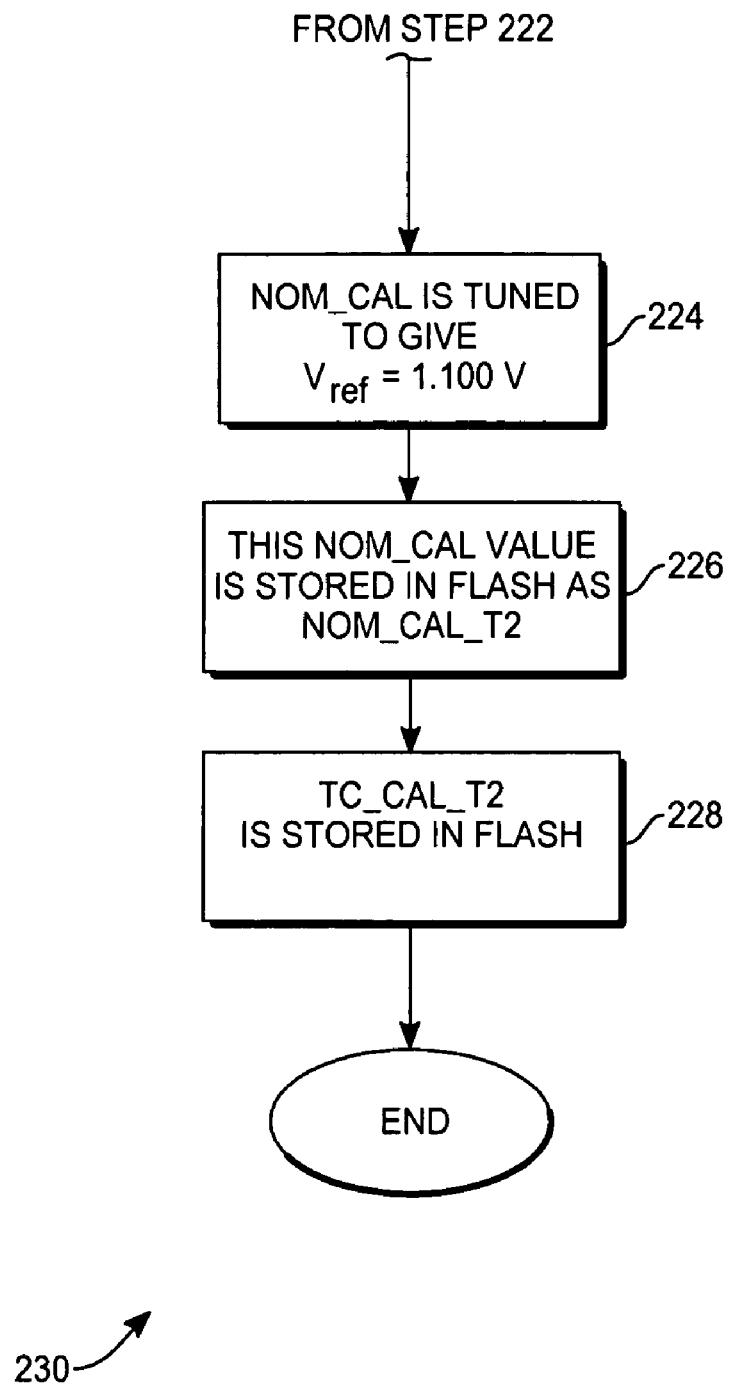
FIG. 9 is a flow chart of the initialization of the second calibration algorithm of FIG. 8.

As shown on the flow chart 230 of FIG. 9 (which is the initialization part of the flow chart 190 of FIG. 8), the integrated system on-chip is initialized by loading the stored right calibration value of the nominal voltage value coefficient NOM_CAL_T2 corresponding to the second temperature T2 into the nominal voltage value coefficient register 116 (of FIG. 6) (at step 226 of FIG. 9), and by loading the stored right calibration value of the voltage temperature coefficient TC_CAL_T2 corresponding to the second temperature T2 into the voltage temperature coefficient register 114 (of FIG. 6) (at step 228 of FIG. 9).

The calibration routine consists of a repeated number of V-ADC measurements (22 of FIG. 1) and adjustments of VREF (18 of FIG. 1). The following timing parameters apply for one measurement and adjustment cycle: estimated settling time for VREF: 400 µs; V-ADC conversion time: 512 µs, calculations: 100 µs. This adds up to approximately 1 ms for each calibration step. The maximum number of calibration steps required in the low temperature calibration algorithm is 7. The total VREF calibration time at temperature T2 is therefore estimated to 7 ms. In addition some time is required for writing the calibration values TC_CAL_T2 and NOM_CAL_T2 to flash memory.

The invention disclosed is of significant economic importance for the following reasons:

(a) Based on simulations it is estimated that it is possible to reduce the temperature drift from ±1% to ±0.25% in the temperature range 0-60° C. for the reference circuit in a chip such as the ATmega406 chip.

(b) The improved temperature stability meets a demand for better absolute accuracy in battery management systems for PC batteries. For example, an ATmega406 chip that included the disclosed invention calibration technique would be a one-chip solution for battery protection and management of rechargeable Li-ion cells;

(c) The invention disclosed makes it possible to get a significantly improved absolute accuracy from on-chip reference sources with only a very small increase in production cost. Thus, the chips utilizing the disclosed in the present invention calibration technique have an important advantage compared to otherwise equal chips.

In contrast to reference voltage calibration, the invention is applicable as a method for temperature calibration of an integrated system on-chip (10 of FIG. 1) with reference to internal time reference source 12 (of FIG. 1). The method comprises the following steps: (A) performing an initial calibration step of the internal (on-chip) time reference source residing on the integrated system on-chip at a first condition (such as temperature); and (B) utilizing a set of initial calibration data obtained at the step (A) to perform at least one subsequent calibration step of the internal time reference source residing on the integrated system on-chip at a second condition. The following steps are applicable: (A1) performing the initial calibration step of the internal time reference source at a first calibration temperature to obtain the set of initial calibration data; an (A2) storing the set of initial calibration data in an internal non-volatile memory built in the integrated system on-chip. This is followed by the following steps: (A1, 1) determining an initial value of the internal time reference source; and (A1, 3) digitally calibrating the internal time reference source at the first temperature. This is followed by the following steps: (B1) loading the initial calibration data corresponding to the first calibration temperature from the non-volatile memory into at least one internal calibration register built in the integrated system on-chip; (B2) applying an external time reference source having substantially sufficient absolute accuracy to the integrated system on-chip; (B3) performing a digital measurement of the external time reference source at the second calibration temperature by using an internal analog-to-digital conversion circuitry built in the integrated system on-chip; (B4) directly calculating a change in a value of the internal time reference at the second calibration temperature as compared with the value of the internal time reference measured at the first calibration temperature thus determining a value of a temperature drift in the value of the internal time reference; (B5) finding a calibration value of a time reference temperature coefficient corresponding to the second calibration temperature by using the value of the temperature drift in the value of the internal time reference; (B6) storing the calibration value of the time reference temperature coefficient corresponding to the second calibration temperature in the non-volatile memory; (B7) digitally calibrating the internal time reference at the second calibration temperature by fine-tuning a nominal internal time reference coefficient, whereby the nominal internal time reference coefficient reaches a calibration value corresponding to the second temperature; and (B8) storing the calibration value of the nominal internal time reference coefficient corresponding to the second temperature in the non-volatile memory.

In still another embodiment, a runtime calibration is performed during the normal operation after the chip has gone through the described above factory calibration. In this embodiment, the calibration value is dependent on the operating temperature. The operating temperature is measured regularly by an internal or external temperature sensor, and the runtime calibration algorithm uses the measured operating temperature and the calibration data stored in non-volatile memory to find the optimal calibration value for the real-time operating temperature.

Figure 10:
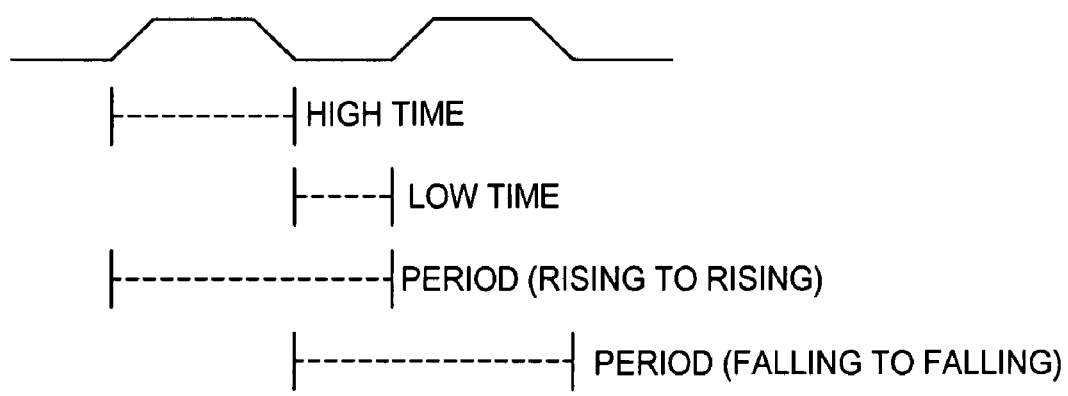
FIG. 10 shows an external timing reference source used for calibration of the integrated system on-chip of FIG. 1 having an internal time reference source.

FIG. 10 depicts an external time reference 250 that can be used to calibrate the internal time reference source (12 of FIG. 1). In one embodiment, the method of the present invention comprises the following steps: (B2, 1) applying an external pulse train as an external time reference; and (B3, 1) measuring a period of the external pulse train by using an internal timer built in the integrated system on-chip. In this embodiment, the internal timer counts a number of on-chip clock periods that corresponds to the period of the external pulse train; and the number of counted clock periods gives a relationship between the external time reference and the internal time reference. In another embodiment, the method of the present invention comprises the following steps: (B2, 2) applying an external crystal or ceramic resonator as an external time reference to an internal oscillator built in the integrated system on-chip; (B3, 2) measuring a period of the external crystal or ceramic resonator by clocking a first external timer on the external crystal or ceramic resonator, and by clocking a second internal timer on the internal oscillator built in the integrated system on-chip; and (B3, 3) comparing a number of counts counted by the first external timer and counted by the second internal timer to obtain the relationship between the external time reference and the internal time reference.

The invention claimed is:

1. A method for calibration of an integrated system on-chip including an internal reference source, said method comprising the steps of:

(A) performing an initial calibration step of said internal reference source residing on said integrated system on-chip at a first operating condition;

(B) utilizing initial calibration data obtained at said step (A) to perform at least one subsequent calibration step of said internal reference source residing on said integrated system on-chip at a second operating condition;

applying an external reference source to said integrated system on-chip;

converting an analog value of said external reference source to a digital value by using an internal analog-to-digital conversion circuitry built in said integrated system on-chip to enable a digital comparison of said external reference source to said internal reference source at a second calibration operating condition;

using an internal calibration circuit built in said integrated system on-chip and using said initial calibration data to solve a calibration algorithm at said second calibration operating condition; wherein said calibration algorithm determines subsequent calibration data that corresponds to a lowest operating condition drift of said internal reference source in an operating range; and storing said subsequent calibration data in a non-volatile memory.

2. The method of claim 1, wherein said step (A) of performing said initial calibration step of said internal reference source at said first operating condition further includes the steps of:

performing said initial calibration step of said internal reference source at a first calibration operating condition to obtain said initial calibration data; and storing said initial calibration data in an internal non-volatile memory.

3. The method of claim 2, wherein said step of performing said initial calibration step of said internal reference source at said first operating condition further includes the steps of:

obtaining an absolute value of said internal reference source at said first operating condition at said first site; and storing said absolute value of said internal reference source obtained at said first operating condition at said first site.

4. The method of claim 1, wherein said step of solving said calibration algorithm further includes the steps of:

determining an initial drift of said absolute value of said internal reference source within an operating range between said first calibration operating condition and said second calibration operating condition;

inputting said initial drift of said absolute value of said internal reference source into said calibration algorithm; and running said calibration algorithm at said second calibration operating condition to identify an optimum calibration data that minimizes an overall drift of said internal reference source.

5. The method of claim 1, wherein said step of storing said subsequent calibration data further includes the step of:

storing said subsequent calibration data in said internal non-volatile memory.

6. The method of claim 1, wherein said step of storing said subsequent calibration data further includes the step of:

storing said subsequent calibration data in an external non-volatile memory.

7. The method of claim 1 further including the steps of:

measuring an actual value of said second operating condition at said subsequent calibration step; wherein said second operating condition at said subsequent calibration step varies within a runtime of said calibration algorithm;

if said actual value of said second operating condition measured at said subsequent calibration step is within an operating range specified by said calibration algorithm, inputting a fixed value of said second operating condition into said calibration algorithm; and if said actual value of said second operating condition measured at said subsequent calibration step is outside said operating range specified by said calibration algorithm, inputting said measured actual value of said second operating condition into said calibration algorithm.

8. The method of claim 1 further defined by fixing the actual values of said second operating condition without measuring an actual value of the second operating condition.

9. The method of claim 1 further including the steps of:

using said internal sensor built in said integrated system on-chip to measure an actual value of said second operating condition at said subsequent calibration step;

determining an initial drift of said absolute value of said internal reference source within an operating range between said first operating condition and said actual value of said second calibration operating condition;

inputting said initial drift of said absolute value of said internal reference source into a calibration algorithm; and running said calibration algorithm at said second calibration operating condition to identify optimum calibration data that minimizes an overall drift of said internal reference source within an operating range.

10. The method of claim 1 further including the steps of:

using said external sensor to measure an actual value of said second operating condition at said subsequent calibration step;

determining an initial drift of said absolute value of said internal reference source within an operating range between said first operating condition and said actual value of said second calibration operating condition;

inputting said initial drift of said absolute value of said internal reference source into a calibration algorithm; and running said calibration algorithm at said second calibration operating condition to identify optimum calibration data that minimizes an overall drift of said internal reference source within an operating range.

11. The method of claim 1 further including the step of:

automatically loading said plurality of internal calibration registers built in said integrated system on-chip with said calibration data obtained at said subsequent calibration step at said second calibration operating condition during said integrated system on-chip system reset sequence.

12. The method of claim 1 further including the steps of:

using said internal sensor to measure and update a value of the runtime operating condition;

performing a runtime calibration of said internal reference source to obtain an optimum calibration value of said internal reference source at said value of said runtime operating condition;

repeating said steps of updating the value of the runtime operating condition and performing the runtime calibration.

13. The method of claim 1 further including the steps of:

using said external sensor to measure and update a value of the runtime operating condition;

performing a runtime calibration of said internal reference source to obtain an optimum calibration value of said internal reference source at said value of said runtime operating condition;

repeating said steps of updating the value of the runtime operating condition and performing the runtime calibration.

14. A method for calibration of an integrated system on-chip including an internal reference voltage source, said method comprising the steps of:

(A) performing an initial calibration step of said internal reference voltage source residing on said integrated system on-chip by determining a voltage temperature coefficient, then fine tuning a reference voltage at a first temperature; and (B) utilizing the fine tuned reference voltage obtained at step (A) to signal changes in said voltage temperature coefficient at a second temperature.

15. The method of claim 14, wherein said step (B) of utilizing said initial calibration data to perform said at least one subsequent calibration step of said internal reference source in said integrated system on-chip at said second temperature further includes the steps of:
applying an external reference source to said integrated system on-chip;
converting an analog value of said external reference source to a digital value by using an internal analog-to-digital conversion circuitry built in said integrated system on-chip to enable a digital comparison of said external reference source to said internal reference source at the second temperature;
using an internal calibration circuit built in said integrated system on-chip and using said initial calibration data to solve a calibration algorithm at said second temperature; wherein said calibration algorithm determines subsequent calibration data that corresponds to a lowest temperature drift of said internal reference source; and
storing said subsequent calibration data in a non-volatile memory.

16. The method of claim 15 further including the steps of:
using said internal temperature sensor to measure and update a value of the runtime operating temperature;
performing a runtime calibration of said internal reference source to obtain an optimum calibration value of said internal reference source at a runtime operating temperature;
repeating said steps of updating the value of the runtime operating temperature and performing the runtime calibration.

17. The method of claim 16 further including the steps of:
using said external temperature sensor to measure and update a value of the runtime operating temperature;
performing a runtime calibration of said internal reference source to obtain an optimum calibration value of said internal reference source at said value of said runtime operating temperature;
repeating said steps of updating the value of the runtime operating temperature and performing the runtime calibration.

18. The method of claim 15, wherein said step of solving said calibration algorithm further includes the steps of:
determining an initial temperature drift of said absolute value of said internal reference source within a temperature range between said first temperature and said second temperature;
inputting said initial temperature drift of said absolute value of said internal reference source into said calibration algorithm; and
running said calibration algorithm at said second temperature to identify optimum calibration data that minimizes an overall temperature drift of said internal reference source, and to calibrate said calibration value of said internal reference source at said second temperature.

19. The method of claim 15, wherein said step of storing said subsequent calibration data further includes the step of:
storing said subsequent calibration data in said internal non-volatile memory.

20. The method of claim 15, wherein said step of storing said subsequent calibration data further includes the step of:
storing said subsequent calibration data in an external non-volatile memory.

21. The method of claim 15 further including the steps of:
measuring an actual value of said second temperature at said subsequent calibration step; wherein said second temperature measured at said subsequent calibration step varies within the runtime of said calibration algorithm;
if said actual value of said second temperature measured at said subsequent calibration step is within a temperature range specified by said calibration algorithm, inputting a fixed value of said second temperature into said calibration algorithm; and
if said actual value of said second temperature measured at said subsequent calibration step is outside said temperature range specified by said calibration algorithm, inputting said measured actual value of said second temperature into said calibration algorithm.

22. The method of claim 15 further defined by fixing the value of the second temperature.

23. The method of claim 15 further including the steps of:
using said internal temperature sensor built in said integrated system on-chip to measure an actual value of said second temperature at said subsequent calibration step;
determining an initial drift of said absolute value of said internal reference source within an operating range between said first temperature and said actual value of said second temperature;
inputting said initial drift of said absolute value of said internal reference source into a calibration algorithm; and
running said calibration algorithm at said second temperature to identify optimum calibration data that minimizes an overall drift of said internal reference source within an operating range.

24. The method of claim 15 further including the steps of:
using said external temperature sensor to measure an actual value of said second temperature at said subsequent calibration step;
determining an initial drift of said absolute value of said internal reference source within an operating range between said first temperature and said actual value of said second temperature;
inputting said initial drift of said absolute value of said internal reference source into a calibration algorithm; and
running said calibration algorithm at said second temperature to identify optimum calibration data that minimizes an overall drift of said internal reference source within an operating range.

25. The method of claim 15 further including the step of:
automatically loading said plurality of internal calibration registers built in said integrated system on-chip with said calibration data obtained at said subsequent calibration step at said second temperature during said integrated system on-chip system reset sequence.

26. The method of claim 14, wherein said step (A) of performing said initial calibration step of said internal reference source at said first temperature further includes the steps of:
performing said initial calibration step of said internal reference source at a first calibration temperature to obtain initial calibration data; and storing said initial calibration data in an internal non-volatile memory.

27. The method of claim 26, wherein said step of performing said initial calibration step of said internal reference source at said first calibration temperature further includes the steps of:
    obtaining an initial nominal value of said internal reference source at said first calibration temperature at a first site; and
    using the initial nominal value of said internal reference source at said first calibration temperature to further calibrate said internal reference source at a second temperature at a second site.

28. The method of claim 26, wherein said step of performing said initial calibration step of said internal reference source at said first operating condition further includes the steps of:
    obtaining an absolute value of said internal reference source at said first temperature at said first site; and
    storing said absolute value of said internal reference source obtained at said first temperature at said first site.

29. A method for calibration of an integrated system on-chip including an internal voltage reference source, said method comprising the steps of:
    (A) performing an initial calibration step of said internal voltage reference source residing on said integrated system on-chip at a first temperature at a first site to obtain an initial voltage temperature coefficient;
    determining and loading the initial voltage temperature coefficient into a voltage temperature coefficient register;
    determining and loading an initial nominal voltage value into a nominal voltage value register; and
    digitally calibrating said initial nominal voltage value at said first temperature by using said voltage temperature coefficient whereby said nominal voltage value reaches a corrected calibration value corresponding to said first temperature;
    storing said corrected calibration data in an internal non-volatile memory; and
    (B) utilizing the corrected calibration data obtained at step (A) to perform at least one subsequent calibration step of said internal voltage reference source residing on said integrated system on-chip at a second temperature at a second site.

30. The method of claim 29, wherein said step (B) of utilizing said initial calibration data to perform said at least one subsequent calibration step of said internal voltage reference source in said integrated system on-chip at said second condition further includes the steps of:
    loading said initial voltage temperature coefficient corresponding to said first temperature from said non-volatile memory into said voltage temperature coefficient register;
    loading said stored right calibration value of said nominal voltage value coefficient corresponding to said first temperature from said non-volatile memory into said nominal voltage value coefficient register;
    applying an external voltage reference source to said integrated system on-chip;
    performing a digital measurement of said external voltage reference source at said second temperature by using an internal analog-to- digital conversion circuitry built in said integrated system on-chip;
    directly calculating a change in a value of said internal voltage reference at said second temperature as compared with said value of said internal voltage reference measured at said first temperature thus determining a value of a temperature drift in said value of said internal voltage reference;
    finding a calibration value of a voltage temperature coefficient corresponding to said second temperature that optimizes said voltage temperature coefficient in a temperature range of interest by using said value of said temperature drift in said value of said internal voltage reference;
    storing said calibration value of said voltage temperature coefficient corresponding to said second temperature in said non-volatile memory;
    finding a calibration value that optimizes said nominal voltage level in said internal voltage reference corresponding to said second temperature; and
    storing said calibration value of said nominal voltage level corresponding to said second temperature in said non-volatile memory.

31. The method of claim 30 further including the steps of:
    using an internal temperature sensor to measure and update a value of a runtime operating temperature;
    performing a runtime calibration of said internal voltage reference source to obtain an optimum calibration value of said internal voltage reference source at said value of said runtime operating temperature; and
    repeating said steps of updating the value of the runtime operating temperature and performing the runtime calibration.

32. The method of claim 31 further including the steps of:
    using an external temperature sensor to measure and update a value of the runtime operating temperature;
    performing a runtime calibration of said internal voltage reference source to obtain an optimum calibration value of said external voltage reference source at said value of said runtime operating temperature; and
    repeating said steps of updating the value of the runtime operating temperature and performing the runt ime calibration.

33. The method of claim 30, wherein said step of finding said calibration value of said voltage temperature coefficient corresponding to said second temperature that optimizes said voltage temperature coefficient in said temperature range of interest by using said value of said temperature drift in said value of said internal voltage reference further includes the steps of:
    determining a number of incremental or decremental steps in order to find a right calibration value for said voltage temperature coefficient corresponding to said second temperature; and
    using said number of incremental or decremental steps in order to find a right calibration value for said voltage temperature coefficient corresponding to said second temperature within a single iteration procedure.

34. The method of claim 30, wherein said step of storing said calibration value of said voltage temperature coefficient corresponding to said second temperature in said non-volatile memory further includes the step of:
    storing said calibration value of said voltage temperature coefficient corresponding to said second temperature in said internal non-volatile memory.

35. The method of claim 30, wherein said step of storing said calibration value of said voltage temperature coefficient corresponding to said second temperature in said non-volatile memory further includes the step of:

storing said calibration value of said voltage temperature coefficient corresponding to said second temperature in said external non-volatile memory.

36. The method of claim 30, wherein said step of storing said calibration level of said nominal voltage value coefficient corresponding to said second temperature in said non-volatile memory further includes the step of:
  storing said calibration level of said nominal voltage coefficient corresponding to said second temperature in said internal non-volatile memory.

37. The method of claim 30, wherein said step of storing said calibration level of said nominal voltage value coefficient corresponding to said second temperature in said non-volatile memory further includes the step of:
  storing said calibration level of said nominal voltage coefficient corresponding to said second temperature in said external non-volatile memory.

38. The method of claim 30 further including the step of:
  automatically initializing said integrated system on-chip by loading said stored corrected calibration value of said voltage temperature coefficient corresponding to said second temperature into said voltage temperature coefficient register and by loading said stored corrected calibration level of said nominal voltage level corresponding to said second temperature into said nominal voltage value coefficient register.

39. A method for calibration of an integrated system on-chip including an internal time reference source, said method comprising the steps of:
  (A) performing an initial calibration step of said internal time reference source residing on said integrated system on-chip by determining a voltage temperature coefficient, at a first operating temperature then fine tuning the time reference source; and
  (B) utilizing initial calibration data obtained at step (A) to signal changes in said fine tuned time reference source residing on said integrated system on-chip at a second temperature.

40. The method of claim 39, wherein said step (B) further includes the steps of:
  applying an external time reference source to said integrated system on-chip;
  performing a digital measurement of said external time reference source at said second temperature by using internal circuitry built in said integrated system on-chip;
  determining an initial drift of said absolute value of said internal time reference source relative to the external time reference source; and
  storing calibration data about said initial drift.

41. The method of claim 40, wherein said step of applying said external time reference source to said integrated system on-chip further includes the step of applying an external pulse train, wherein said step of performing said digital measurement of said external time reference source at said second calibration operating condition further includes the step of:
  measuring a period of said external pulse train by using an internal timer built in said integrated system on-chip, wherein said internal timer counts a number of on-chip clock periods that corresponds to said period of said external pulse train;
  and wherein said number of counted clock periods gives a relationship between said external time reference and said internal time reference.

42. The method of claim 40, wherein said step of applying said external time reference source to said integrated system on-chip further includes the step of applying an external crystal or ceramic resonator to an internal oscillator built in said integrated system on-chip, wherein said step of performing said digital measurement of said external time reference source at said second calibration operating condition further includes the steps of:
  measuring a period of said external crystal or ceramic resonator by clocking a first internal timer on said external crystal or ceramic resonator, and by clocking a second internal timer on said internal oscillator built in said integrated system on-chip; and
  comparing a number of counts counted by said first internal timer and counted by said second internal timer to obtain a relationship between said external time reference and said internal time reference.

43. The method of claim 39, wherein said step (A) of performing said initial calibration step of said internal time reference source at said first operating condition further includes the step of:
  storing said voltage temperature coefficient in an internal non-volatile memory built in said integrated system on-chip.

44. The method of claim 43, wherein said step of performing said initial calibration step of said internal time reference source at said first calibration operating condition to obtain said initial calibration data further includes at least the following step:
  determining an initial absolute value of said internal time reference source.

45. The method of claim 39 further including the steps of:
  using an internal sensor to measure and update a value of the runtime operating condition;
  performing a runtime calibration of said internal time reference source to obtain an optimum calibration value of said internal time reference source at said value of said runtime operating condition;
  repeating said steps of updating the value of the runtime operating condition and performing the runtime calibration.

46. The method of claim 39 further including the steps of:
  using an external sensor to measure and update a value of a runtime operating temperature;
  performing a runtime calibration of said internal time reference source to obtain an optimum calibration value of said internal time reference source at said value of said runtime operating temperature;
  repeating said steps of updating the value of the runtime operating temperature and performing the runtime calibration.

47. A method for calibration of an integrated system on-chip including an internal time reference source, said method comprising the steps of:
  (A) performing an initial calibration step of said internal time reference source residing on said integrated system on-chip at a first temperature;
  performing said initial calibration step of said internal time reference source at said first calibration temperature to obtain said initial calibration data;
  storing said initial calibration data in an internal non-volatile memory built in said integrated system on-chip;
  determining an initial absolute value of said internal time reference sources; and
  (B) utilizing initial calibration data obtained at said step (A) to perform at least one subsequent calibration step of said internal time reference source residing on said integrated system on-chip at a second temperature;

applying an external time reference source to said integrated system on-chip;
performing a digital measurement of said external time reference source at said second calibration temperature by using internal conversion circuitry built in said integrated system on-chip;
determining an initial drift of said absolute value of said internal time reference source relative to the external time reference source; and
storing calibration data about said initial drift in said non-volatile memory.

48. The method of claim 47 further including the steps of:
using an internal sensor to measure and update a value of the runtime operating temperature;
performing runtime calibration of said internal time reference source to obtain an optimum calibration value of said internal time reference source at said value of said runtime operating temperature;
repeating said steps of updating the value of the runtime operating temperature and performing the runtime calibration.

49. The method of claim 47 further including the steps of:
using an external sensor to measure and update a value of the runtime operating condition;
performing runtime calibration of said internal time reference source to obtain an optimum calibration value of said internal time reference source at said value of said runtime operating condition;
repeating said steps of updating the value of the runtime operating condition and performing the runtime calibration.

50. The method of claim 47, wherein said step of applying said external time reference source to said integrated system on-chip further includes the step of applying an external pulse train, wherein said step of performing said digital measurement of said external time reference source at said second calibration temperature further includes the step of:
measuring a period of said external pulse train by using an internal timer built an said integrated system on-chip, wherein said internal timer counts a number of on-chip clock periods that corresponds to said period of said external pulse train;
and wherein said number of counted clock periods gives a relationship between said external time reference and said internal time reference.

51. The method of claim 47, wherein said step of applying said external time reference source to said integrated system on-chip further includes the step of applying an external crystal or ceramic resonator to an internal oscillator built in said integrated system on-chip, wherein said step of performing said digital measurement of said external time reference source at said second calibration temperature further includes the steps of:
measuring a period of said external crystal or ceramic resonator by clocking a first internal timer on said external crystal or ceramic resonator, and by clocking a second internal timer on said internal oscillator built in said integrated system on-chip; and
comparing a number of counts counted by said first internal timer and counted by said second internal timer to obtain a relationship between said external time reference and said internal time reference.

52. An apparatus for temperature calibration of an internal reference source residing on an integrated system on-chip, said apparatus comprising:
said internal reference source;
a converter coupled to said internal reference source, and coupled to an external reference source; said converter configured to convert an analog value of said external reference source to a digital value;
a calibration circuit coupled to said converter;
an internal non-volatile memory coupled to said calibration circuit; said internal non-volatile memory configured to store initial calibration data and subsequent calibration data; wherein said calibration circuit is configured to run a calibration algorithm to calibrate said internal reference source to an initial temperature at a first site, and to calibrate said internal reference source to a runtime operating temperature by using said initial calibration data written into said internal non-volatile memory; and
at least one calibration register coupled to said internal reference source, and coupled to said internal non-volatile memory; wherein said calibration register is configured to collect said initial calibration data from said internal non-volatile memory, is configured to upload said initial calibration data into said internal reference source, and is configured to enable said calibration circuit to run said calibration algorithm.

53. The apparatus of claim 52 further including:
an internal temperature sensor coupled to said calibration circuit, said internal temperature sensor configured to substantially regularly measure said runtime operating temperature, wherein said calibration circuit is configured to substantially regularly run said calibration algorithm based on said updated value of said runtime operating temperature in order to substantially regularly calibrate said internal reference source according to said updated runtime operating temperature.

54. The apparatus of claim 52 further including:
an external temperature sensor coupled to said calibration circuit, said external temperature sensor configured to substantially regularly measure said runtime operating temperature; wherein said calibration circuit is configured to substantially regularly run said calibration algorithm based on said updated value of said runtime operating temperature in order to substantially regularly calibrate said internal reference source according to said updated runtime operating temperature.

55. The apparatus of claim 52 further including:
an external non-volatile memory coupled to said calibration circuit; wherein said external non-volatile memory is configured to store said initial calibration data and said subsequent calibration data.

56. A computer-readable storage medium useful in association with an integrated system on-chip; said integrated system on-chip having a processor and memory, said integrated system on-chip being coupled to a calibration test set-up, said calibration test set-up having a nominal voltage value coefficient register and a voltage temperature coefficient register, said computer-readable storage medium including computer-readable code instructions configured to cause said processor to execute the steps of:
determining and loading an initial voltage temperature coefficient corresponding to said first temperature into a voltage temperature coefficient register;
determining and loading an initial nominal voltage value coefficient corresponding to said first temperature into a nominal voltage value coefficient register;
digitally calibrating said voltage reference at said first temperature by fine-tuning said nominal voltage value coefficient whereby said nominal voltage value coefficient reaches a right calibration value corresponding to said first temperature; and storing said right calibration value of said nominal voltage value coefficient corresponding to said first temperature in a non-volatile memory.

57. A computer-readable storage medium useful in association with an integrated system on-chip; said integrated system on-chip having a processor and memory, said integrated system on-chip being coupled to a calibration test set-up, said calibration test set-up having a nominal voltage value coefficient register and a voltage temperature coefficient register, said computer-readable storage medium including computer-readable code instructions configured to cause said processor to execute the steps of:

(a) determining and loading an initial voltage temperature coefficient corresponding to said first temperature into a voltage temperature coefficient register;

(b) determining and loading an initial calibration value of a nominal voltage value coefficient corresponding to said first temperature into a nominal voltage value coefficient register;

(c) performing a digital measurement corresponding to said second temperature of a predefined analog reference voltage by using an internal on-chip analog-to-digital voltage conversion operation of said predefined analog reference voltage;

(d) calculating a measurement error of said measured digital voltage value of said predefined analog reference voltage corresponding to said second temperature;

(e) finding a calibration value for said voltage temperature coefficient corresponding to said second temperature;

(f) storing said calibration value for said voltage temperature coefficient in said non-volatile memory;

(g) digitally calibrating a voltage reference at said second temperature by fine-tuning said nominal voltage value coefficient whereby said nominal voltage value coefficient reaches a calibration value corresponding to said second temperature;

(h) storing said calibration value of said nominal voltage value coefficient corresponding to said second temperature in said non-volatile memory;

(i) loading said stored voltage temperature coefficient corresponding to said second temperature into said voltage temperature coefficient register;

(j) loading said stored calibration value of said nominal voltage value coefficient corresponding to said second temperature into said nominal voltage value coefficient register; and (k) initializing said integrated system on-chip by loading said stored right calibration value of said voltage temperature coefficient corresponding to said second temperature into said voltage temperature coefficient register and by loading said stored right calibration value of said nominal voltage value coefficient corresponding to said second temperature into said nominal voltage value coefficient register.

* * * * *

UNITED STATES PATENT AND TRADEMARK OFFICE
CERTIFICATE OF CORRECTION

PATENT NO. : 7,340,366 B2
APPLICATION NO. : 10/795027
DATED : March 4, 2008
INVENTOR(S) : Aas et al.

Figure 5:
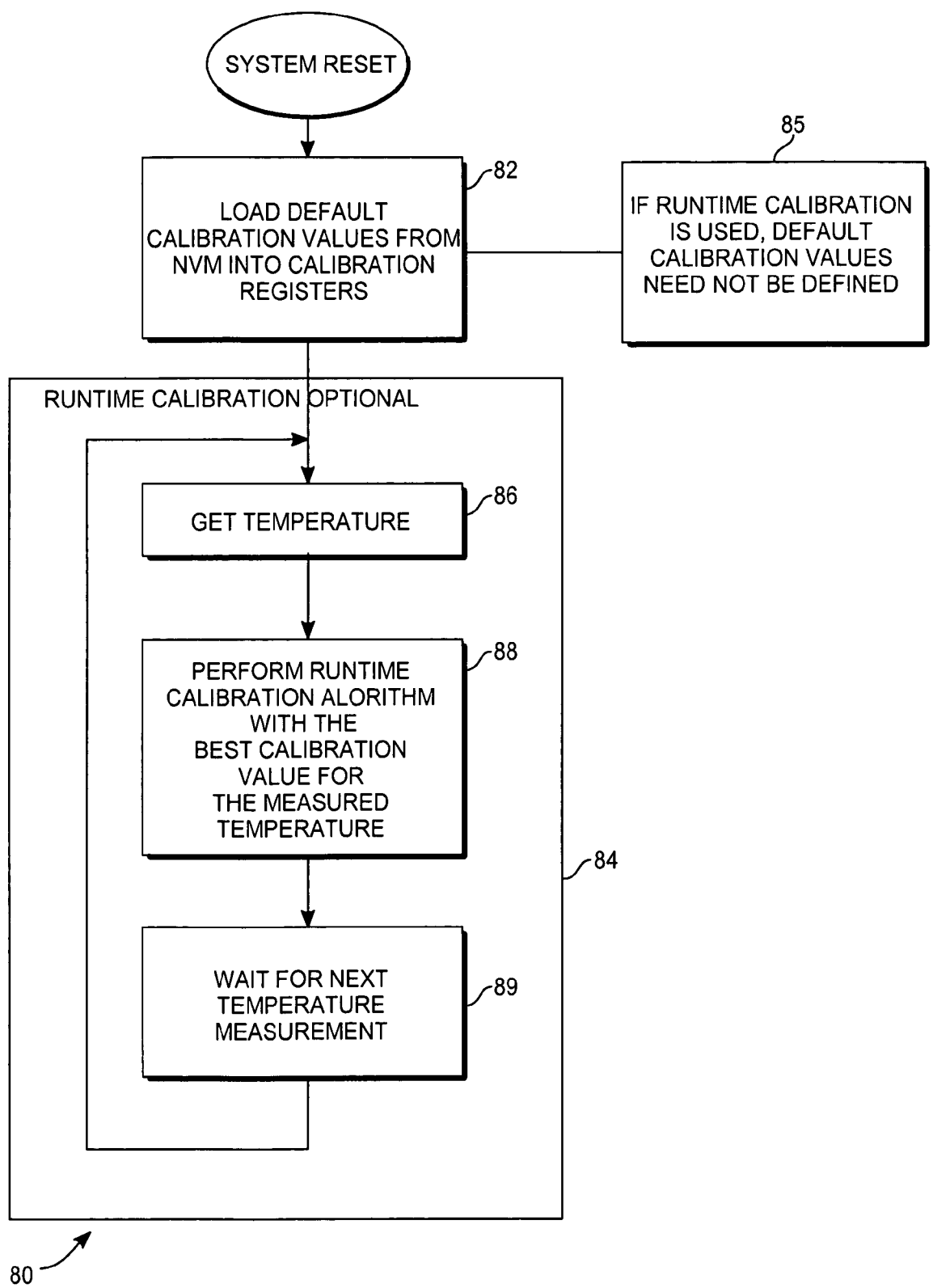
FIG. 5 is a flow chart of a runtime calibration procedure of the system of FIG. 1.

It is certified that error appears in the above-identified patent and that said Letters Patent is hereby corrected as shown below:

On sheet 5 of 10, in Fig. 5 (Reference Numeral 88), line 2, delete "ALORITHM" and insert -- ALGORITHM --, therefor.

In column 9, line 25, before "voltage" delete "gap".

In column 24, line 39, in Claim 32, delete "runt ime" and insert -- runtime --, therefor.

In column 27, line 40, in Claim 50, delete "an" and insert -- in --, therefor.

Signed and Sealed this

Seventh Day of October, 2008

JON W. DUDAS
*Director of the United States Patent and Trademark Office*